(12) United States Patent
Suehiro et al.

(10) Patent No.: US 8,309,969 B2
(45) Date of Patent: Nov. 13, 2012

(54) LIGHT EMITTING DEVICE AND METHOD OF MAKING SAME

(75) Inventors: Yoshinobu Suehiro, Aichi-ken (JP); Koji Tasumi, Aichi-ken (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 334 days.

(21) Appl. No.: 12/623,135

(22) Filed: Nov. 20, 2009

(65) Prior Publication Data

US 2010/0123164 A1    May 20, 2010

(30) Foreign Application Priority Data

Nov. 20, 2008 (JP) ................................ 2008-296938
Mar. 30, 2009 (JP) ................................ 2009-082158
Sep. 24, 2009 (JP) ................................ 2009-219604

(51) Int. Cl.
*H01L 27/15* (2006.01)
*H01L 29/26* (2006.01)
*H01L 31/12* (2006.01)
*H01L 33/00* (2010.01)

(52) U.S. Cl. ............... 257/79; 257/81; 257/91; 257/99; 362/218; 362/294; 362/373; 362/219

(58) Field of Classification Search ............ 257/79, 257/91, 81, 99; 362/218, 219, 294, 373
See application file for complete search history.

(56) References Cited

U.S. PATENT DOCUMENTS

| | | | |
|---|---|---|---|
| 2005/0019971 A1* | 1/2005 | Slater et al. | 438/33 |
| 2006/0001361 A1 | 1/2006 | Imai et al. | |
| 2008/0043444 A1* | 2/2008 | Hasegawa et al. | 361/717 |
| 2008/0283860 A1* | 11/2008 | Suehiro et al. | 257/98 |
| 2008/0284310 A1* | 11/2008 | Suehiro | 313/498 |
| 2009/0115833 A1* | 5/2009 | Soulliaert et al. | 347/238 |
| 2009/0122541 A1* | 5/2009 | Suehiro et al. | 362/235 |

FOREIGN PATENT DOCUMENTS

JP    1-143227    6/1989
JP    2006-5290    1/2006

* cited by examiner

*Primary Examiner* — Telly Green
(74) *Attorney, Agent, or Firm* — McGinn IP Law Group, PLLC

(57) ABSTRACT

A light emitting device includes a light-emitting portion including a metal part including a metal able to be bonded to a solder material, and a heat dissipation member that includes aluminum, aluminum alloy, magnesium or magnesium alloy and a bonding portion processed to be bonded to the solder material. The metal part of the light-emitting portion is bonded via the solder material to the bonding portion of the heat dissipation member. The solder material includes a material unable to be directly bonded to the heat dissipation member, the metal part of the light-emitting portion is formed by metalizing an insulation of ceramic or semiconductor, and the bonding portion includes a thermal expansion coefficient between that of the heat dissipation member and that of the insulation.

19 Claims, 44 Drawing Sheets

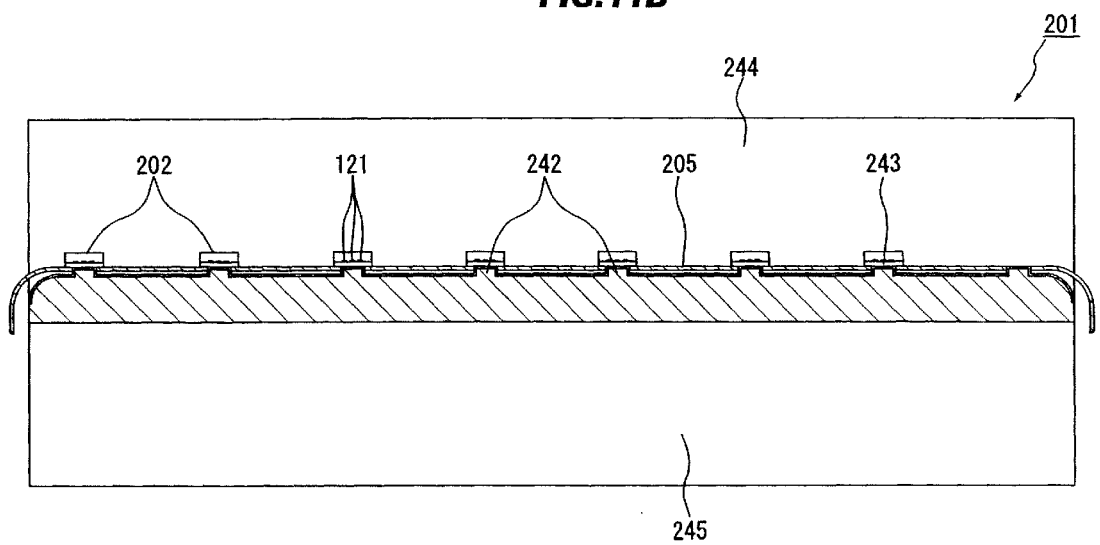

FIG.12C

| | CONTACT PORTION LENGTH | CONTACT PORTION WIDTH | CONTACT AREA | FED POWER | CONTACT AREA/ FED POWER | LIGHT-EMITTING PORTION-FIN TEMPERATURE DIFFERENCE |
|---|---|---|---|---|---|---|
| | mm | mm | mm² | (W) | mm²/W | (°C) |
| INVENTION EXAMPLE | 1.3 | 0.6 | 0.78 | 0.96 | 0.8 | 18.0 |
| COMPARATIVE EXAMPLE 1 | 18 | 50 | 900 | 0.96 | 934.7 | 18.5 |
| | 18 | 50 | 900 | 2.03 | 444.4 | 21.6 |
| | 18 | 50 | 900 | 3.27 | 275.5 | 24.0 |
| | 18 | 50 | 900 | 5.93 | 151.7 | 30.5 |
| | 18 | 50 | 900 | 8.65 | 104.0 | 35.0 |
| | 18 | 50 | 900 | 14.73 | 61.1 | 46.4 |
| | 18 | 50 | 900 | 24.75 | 36.4 | 62.9 |
| | 18 | 50 | 900 | 39.41 | 22.8 | 72.8 |
| COMPARATIVE EXAMPLE 2 | 18 | 50 | 900 | 0.96 | 940.2 | 17.6 |
| | 18 | 50 | 900 | 2.00 | 449.7 | 17.8 |
| | 18 | 50 | 900 | 3.20 | 281.7 | 18.7 |
| | 18 | 50 | 900 | 8.69 | 103.6 | 21.3 |
| | 18 | 50 | 900 | 14.94 | 60.2 | 23.9 |
| | 18 | 50 | 900 | 25.10 | 35.9 | 28.7 |
| | 18 | 50 | 900 | 40.76 | 22.1 | 36.1 |

LIGHT EMITTING DEVICE AND METHOD OF MAKING SAME

The present application is based on Japanese patent application Nos. 2008-296938, 2009-082158 and 2009-219604 filed on Nov. 20, 2008, Mar. 30, 2009 and Sep. 24, 2009, respectively, the entire contents of which are incorporated herein by reference.

BACKGROUND OF THE INVENTION

1. Field of the Invention

This invention relates to a light emitting device with a heat dissipation member formed of aluminum, aluminum alloy, magnesium or magnesium alloy. Also, this invention relates to a method of making the light emitting device.

2. Description of the Related Art

JP-A-2006-005290 discloses a light emitting device that is composed of a high heat conductivity heat dissipation base with a die bonding mount surface, a circuit board disposed on the heat dissipation base and having a hole for exposing a part of the mount surface and a flared portion flaring outside a peripheral edge of the heat dissipation base, a light emitting element mounted through the hole and on the mount surface, and a transparent resin material for sealing the upper part of the light emitting element. The light emitting device of JP-A-2006-005290 is disposed as the heat dissipation base is contacted with the outer surface of a housing of an electric instrument.

However, the light emitting device of JP-A-2006-005290 may cause the problem that, when the housing is formed of aluminum, aluminum alloy, magnesium or magnesium alloy, oxide film will be produced on the surface of the housing such that it cannot be directly bonded to the housing via a general solder material. Therefore, a bonding sheet of an adhesive resin needs to be put between the heat dissipation base and the housing, or the heat dissipation base and the housing need to be fixed by a fastening member such as a screw. Thereby, the number of parts or production steps will increase. Furthermore, the oxide film formed on the surface of the housing will increase a thermal resistance between the heat dissipation base and the housing to lower the heat dissipation efficiency.

SUMMARY OF THE INVENTION

It is an object of the invention to provide a light emitting device that uses a heat dissipation member formed of aluminum, aluminum alloy, magnesium or magnesium alloy without increasing the number of parts or production steps so as to enhance the heat dissipation efficiency.

(1) According to one embodiment, a light emitting device comprises:
a light-emitting portion including a metal part comprising a metal able to be bonded to a solder material; and
a heat dissipation member that comprises aluminum, aluminum alloy, magnesium or magnesium alloy and a bonding portion processed to be bonded to the solder material,
wherein the metal part of the light-emitting portion is bonded via the solder material to the bonding portion of the heat dissipation member,
the solder material comprises a material unable to be directly bonded to the heat dissipation member,
the metal part of the light-emitting portion is formed by metalizing an insulation of ceramic or semiconductor, and
the bonding portion comprises a thermal expansion coefficient between that of the heat dissipation member and that of the insulation.

In the above embodiment (1), the following modifications and changes can be made.

(i) The heat dissipation member comprises a main body extending from the bonding portion in a predetermined direction, and a plurality of fins integrated with the main body.

(ii) The light-emitting portion comprises an LED element, a mount portion of ceramics for mounting the LED element, a sealing portion of an inorganic material for sealing the LED element on the mount portion.

(iii) The main body of the heat dissipation member is formed into a plate, the light-emitting portion is mounted on an end face of the main body, and the fins extend from a main surface of the main body.

(iv) The heat dissipation member forms a housing comprising an opening for enclosing the light-emitting portion, and
the light emitting device further comprises a phosphor layer at the opening for converting a wavelength of light emitted from the light-emitting portion.

(v) The heat dissipation member further includes a reflecting mirror portion for reflecting light emitted from the light-emitting portion.

(vi) The light-emitting portion comprises a plurality of light-emitting portions that form a linear light source while being arranged in a row.

(vii) The bonding portion comprises aluminum, aluminum alloy, magnesium or magnesium alloy, and a metal that is able to be bonded to the solder material and dispersed into the aluminum, aluminum alloy, magnesium or magnesium alloy.

(2) According to another embodiment, a method of producing the light emitting device according to the above embodiment (1) comprises:
disposing a metal member able to be bonded to the solder material on a surface of the heat dissipation member that comprises aluminum, aluminum alloy, magnesium or magnesium alloy, and is formed by extrusion molding or die casting; and
forming the bonding portion by pressing the metal member while applying ultrasonic wave to an interface between the heat dissipation member and the metal member.

In the above embodiment (2), the following modifications and changes can be made.

(viii) The metal member comprises a metal foil, and
the pressing of the metal foil is conducted by using a tool with a concavo-convex surface formed on a contact surface with the metal foil.

(ix) The bonding portion is formed after the heat dissipation member is previously alumite treated.

(3) According to another embodiment, a light emitting device comprises:
a light-emitting portion including a metal part comprising a metal able to be bonded to a solder material; and
a heat dissipation member that comprises aluminum, aluminum alloy, magnesium or magnesium alloy and a bonding portion processed to be bonded to the solder material,
wherein the bonding portion comprises a zinc plating, and
the metal part of the light-emitting portion is bonded via the solder material to the bonding portion of the heat dissipation member.

Points of the Invention

A light emitting device according to one embodiment of the invention is constructed such that a heat dissipation member of aluminum that is difficult to bond to a solder material is provided with a bonding portion that is processed to be bonded to the solder material. Thus, the heat dissipation member can be bonded via the solder material to a light-emitting portion. Therefore, a fastening member such as a screw and a resin sheet for adhesion are not needed. As a result, the number of parts and the production steps can be decreased to reduce the production cost.

BRIEF DESCRIPTION OF THE DRAWINGS

The preferred embodiments according to the invention will be explained below referring to the drawings, wherein:

FIG. 11B is a side cross sectional view showing the light emitting device in FIG. 11A;

FIG. 12C is a table showing experimental result data in Invention Example, Comparative Example 1 and Comparative Example 2;

DETAILED DESCRIPTION OF THE PREFERRED EMBODIMENTS

First Embodiment

Figure 1:
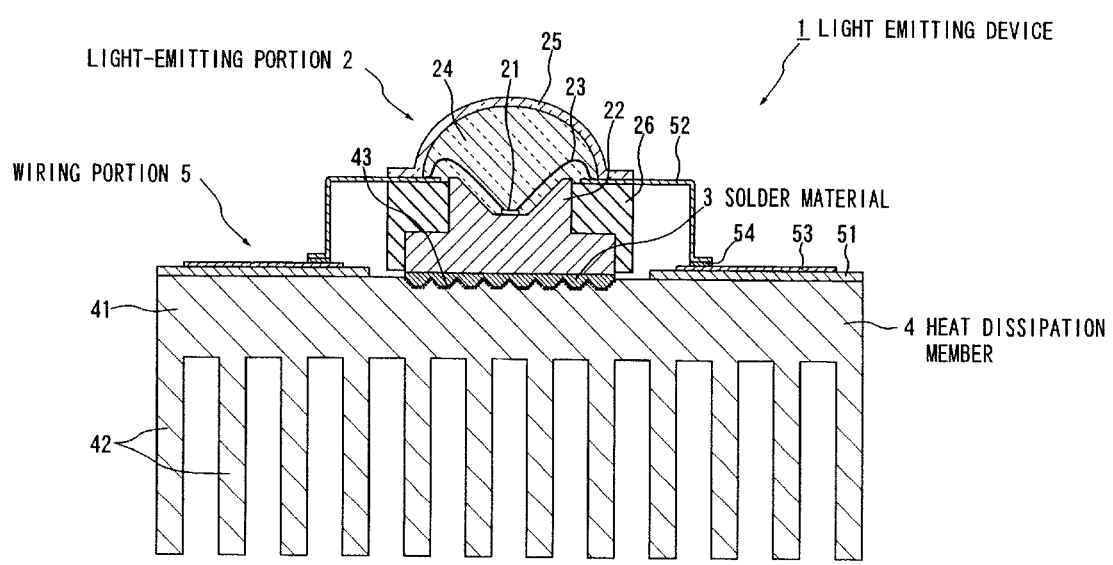
FIG. 1 is a cross sectional view showing a light emitting device in a first preferred embodiment according to the invention.

FIGS. 1 to 4 illustrate the first embodiment of the invention, where FIG. 1 is a cross sectional view showing a light emitting device in the first embodiment according to the invention.

As shown in FIG. 1, the light emitting device 1 is composed of a light-emitting portion 2 including an LED (light-emitting diode) element 21 etc., a heat dissipation member 4 connected via a solder material 3 to the light-emitting portion 2, and a wiring portion 5 for feeding power to the light-emitting portion 2. The wiring portion 5 includes a glass epoxy substrate 51 mounted on the heat dissipation member 4, and a lead 52 for connecting the glass epoxy substrate 51 and the light-emitting portion 2. The heat dissipation member 4 is of aluminum, and the solder material 3 is of a material unable to have direct adhesion to the heat dissipation member 4. Herein, "unable to have direct adhesion" means a state that it is not possible to have adhesion by metal bonding due to an oxide layer formed on the surface of the heat dissipation member 4.

The light-emitting portion 2 is composed of the LED element 21 for emitting light with a predetermined wavelength, a mount portion 22 for mounting the LED element 21 thereon, a wire 23 of gold etc. for electrically connecting the lead 52 and electrodes of the LED element 21, a sealing portion 24 for sealing the LED element 21 and the wires 23, a cover layer 25 for covering the surface of the sealing portion 24, and an insulating portion 26 formed between the mount portion 22 and the lead 52.

The LED element 21 is formed of a semiconductor material represented by, e.g., $In_xAl_yGa_{1-x-y}N$ ($0 \leq x \leq 1$, $0 \leq y \leq 1$, $0 \leq x+y \leq 1$) and emits, e.g., blue light. The semiconductor material of the LED element 21 can be arbitrarily selected and another semiconductor material such as AlGaAs-based material, GaAsP-based material etc. In this embodiment, the LED element 21 is face-up type where a p-electrode and an n-electrode are formed on the top surface.

The mount portion 22 is formed of a metal material to be bonded to the solder material 3 and is in this embodiment formed of a copper slag. The mount portion 22 as a metal part is formed concave on the upper side, and the LED element 21 is mounted on the bottom of the concave part. The inside wall of the concave part is formed tapered enlarging in inner circumference upward. The lower side of the mount portion 22 is formed to have a greater width than the upper side such that it can be contacted with the heat dissipation member 4 at a large area via the solder material 3.

The sealing portion 24 is formed of a transparent material such as resin and glass for sealing the LED element 21 and the wires 23. The cover layer 25 is formed of a transparent material such as resin and glass, along the surface of the top surface of the sealing portion 24. The upper side of the sealing portion 24 is shaped like a lens for focusing light emitted from the LED element 21 by the sealing portion 24 and the cover layer 25. In this embodiment, the sealing portion 24 is formed of silicone and the cover layer 25 is formed of acrylic resin.

The insulating portion 26 is formed outside the mount portion 22 and one end of the lead 52 is disposed thereon. In this embodiment, the insulating portion 26 is formed of resin.

The heat dissipation member 4 is of aluminum, and is composed of a main body 41 to which the light-emitting portion 2 is bonded via the solder material 3, and plural fins 42 formed protruding from the main body 41. The main body 41 is formed into a flat rectangle by extruding an aluminum material such as 1000-system which is close to pure aluminum and 6000-system including Si, Mg etc. at 5 ton/cm² and at about 500° C. and has a bonding portion 43 processed to be bonded to the solder material 3 at the center of the top surface. The fins 42 are each shaped like a plate protruding downward from the bottom of the main body 41 and are disposed parallel to each other.

The material of the solder material 3 may be optional. For example, it may be Sn—Sb based solder, Sn—Cu based solder, Sn—Ag based solder, Sn—Zn base solder, Sn—Bi based solder etc. In this embodiment, the solder material 3 is about 20 to 100 μm in thickness. Sn—Pb based solder and Zn—Cd—Bi based solder are known as a solder material able to be bonded to aluminum, but they have the problems that it is subjected to oxidization, galvanic corrosion and it is large in thermal expansion coefficient. Without using such a special material able to have direct adhesion to aluminum, this embodiment uses a general solder material that can facilitate the solder bonding process to enhance the workability.

The heat dissipation member 4 is difficult to bond directly to the solder material 3 since it is formed of aluminum which is likely to form oxide film on the surface. However, in this embodiment, the bonding portion 43 able to be bonded to the solder material 3 is formed by processing the heat dissipation member 4. The solder material 3 is filled on the bonding portion 43 so as to connect mechanically and thermal conductively the mount portion 22 of the light-emitting portion 2 and the heat dissipation member 4. The processing method for the bonding portion 43 will be described later.

The glass epoxy substrate 51 is mounted on the main body 41 of the heat dissipation member 4 and provided with a circuit pattern 53 thereon. One end of the lead 52 is connected via the solder material 54 to the circuit pattern 53, and the other end thereof is disposed on the insulating portion 26 and connected to the wire 23.

Figure 2A:
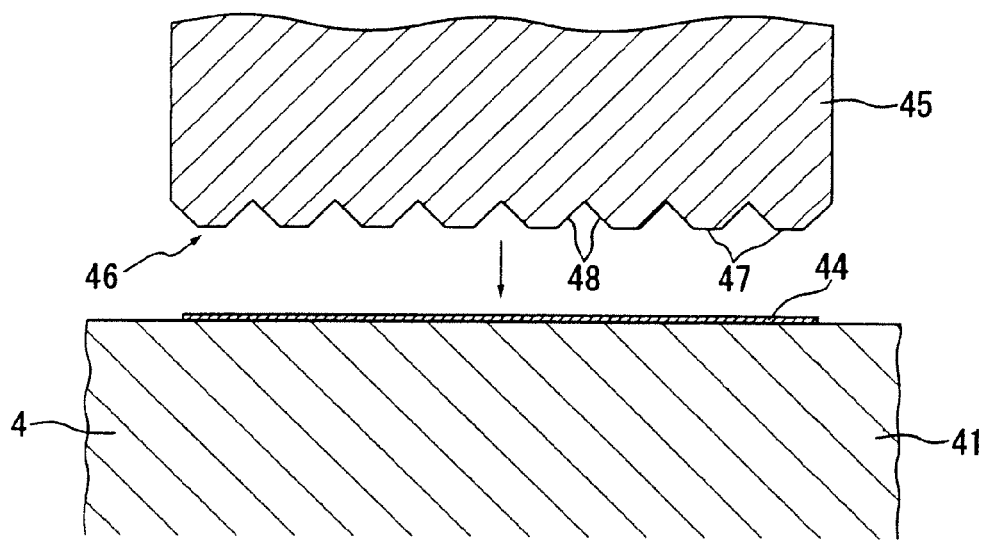
FIG. 2A is a cross sectional view showing a heat dissipation member before being processed.
Figure 2B:
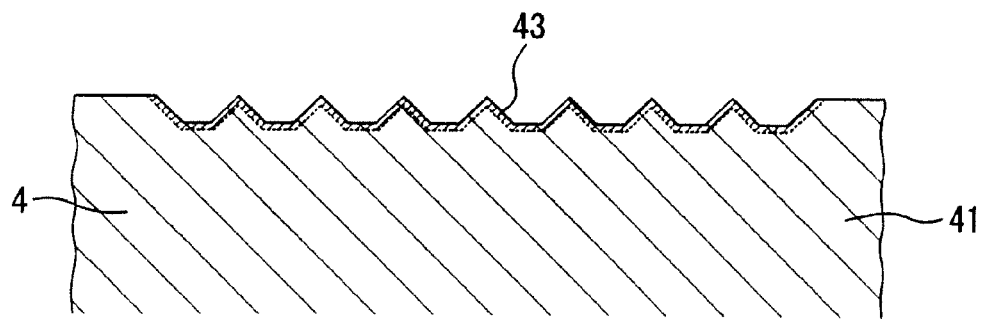
FIG. 2B is a cross sectional view showing a heat dissipation member after being processed.

The processing method for the bonding portion 43 of the heat dissipation member 4 will be described below referring to FIGS. 2A, 2B and 4. FIG. 2A is a cross sectional view showing the heat dissipation member before being processed. FIG. 2B is a cross sectional view showing the heat dissipation member after being processed.

At first, as shown in FIG. 2A, a copper foil 44 is disposed on the top surface of the main body 41 of the heat dissipation member 4. In this embodiment, the thickness of the copper foil 44 is 50 μm. Then, a processing tool 45 with a concavity and convexity on a contact surface 46 thereof is provided and brought close to the main body 41 with the copper foil 44 thereon. Then, as shown in FIG. 2B, a load is applied to the processing tool 45 while ultrasonic wave is applied to the interface between the copper foil 44 and the main body 41, so that the processing tool 45 is pressed into the main body 41 by having the contact surface 46 contact with the copper foil 44 and pressing the copper foil 44. Thereby, bonding portion 43 with a concavity and convexity on the surface is formed. Then, the bonding portion 43 is processed by the ultrasonic wave application such that atomic diffusion near at the interface causes blend of copper and aluminum so that copper concentration decreases continuously from the surface to the inside and the interface cannot be clearly observed even by using a microscope etc. Meanwhile, for convenience of explanation, the interface between the inside of the main body 41 and the bonding portion 43 is shown in the drawings. Along with this, the surface aluminum oxide film can be also diffused and the surface oxide film is as thin as less than 100 Å, so that the bonding portion 43 is nearly in a state that there is no surface oxide film.

Even when the aluminum is alumite treated to have oxide film of, e.g., 10 μm or so, the bonding portion 43 is nearly in a state that there is no surface oxide film. Thus, even after the heat dissipation member 4 is enhanced 10 to 20% in heat dissipation efficiency by the alumite treatment, the solder bonding of the light-emitting portion 2 to the heat dissipation member 4 can be enabled by forming the bonding portion 43. For example, even when the heat dissipation member 4 is entirely alumite treated not partially alumite treated by using a mask etc., a light emitting device with high heat dissipation efficiency can be easy produced.

Figure 3:
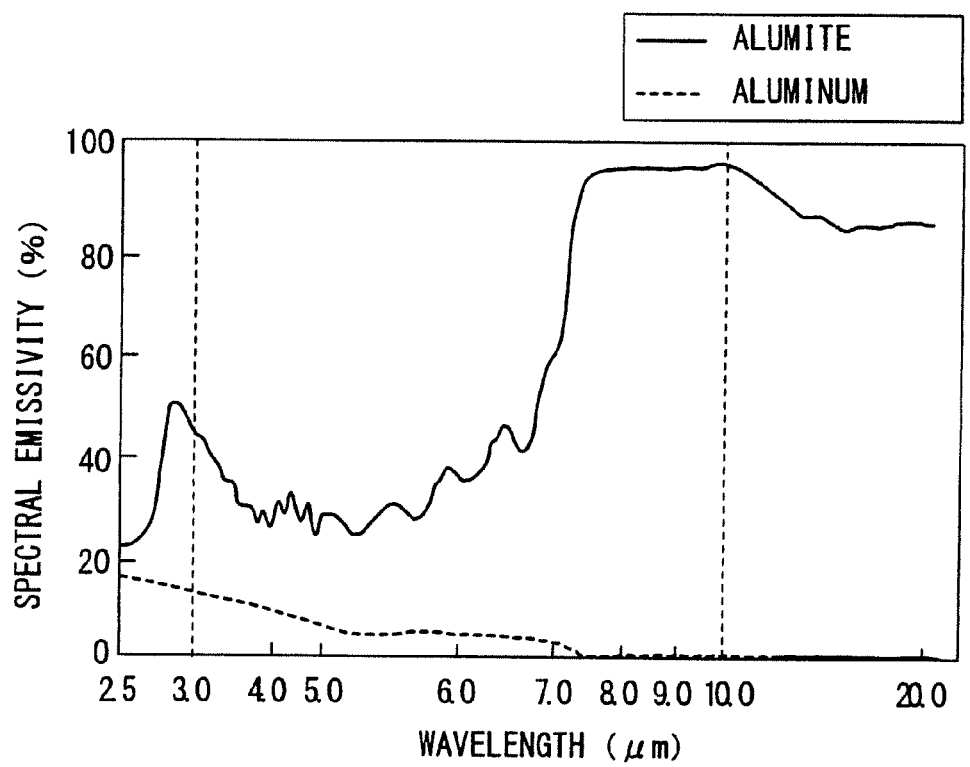
FIG. 3 is a graph showing a spectral emissivity of aluminum and alumite (i.e., aluminum oxide layer.

FIG. 3 is a graph showing a spectral emissivity of aluminum and alumite (i.e., aluminum oxide layer. For example, as shown in FIG. 3, in a wavelength region of about 4 μm or more, the spectral emissivity of aluminum is less than 10% of black-body radiation. By contrast, when the alumite film is formed on the surface of the aluminum material, especially in a region of about 8 to 20 μm, the spectral emissivity can be 80% or more of black-body radiation. As shown in FIG. 3, the alumite film is higher in spectral emissivity than the aluminum in all wavelength regions and the spectral emissivity can be enhanced even at a wavelength region of less than 8 μm with respect to the aluminum. In addition, at a wavelength region of less than 8 μm, the heat dissipation property can be enhanced by coating, e.g., a ceramic with relatively high spectral emissivity. This is effective when the heat dissipation member 4 is at high temperature such that the spectrum peak of spectral emissivity is shifted to a short wavelength side, e.g., when the heat dissipation member 4 is at high temperature of 100° C. or more.

Figure 4:
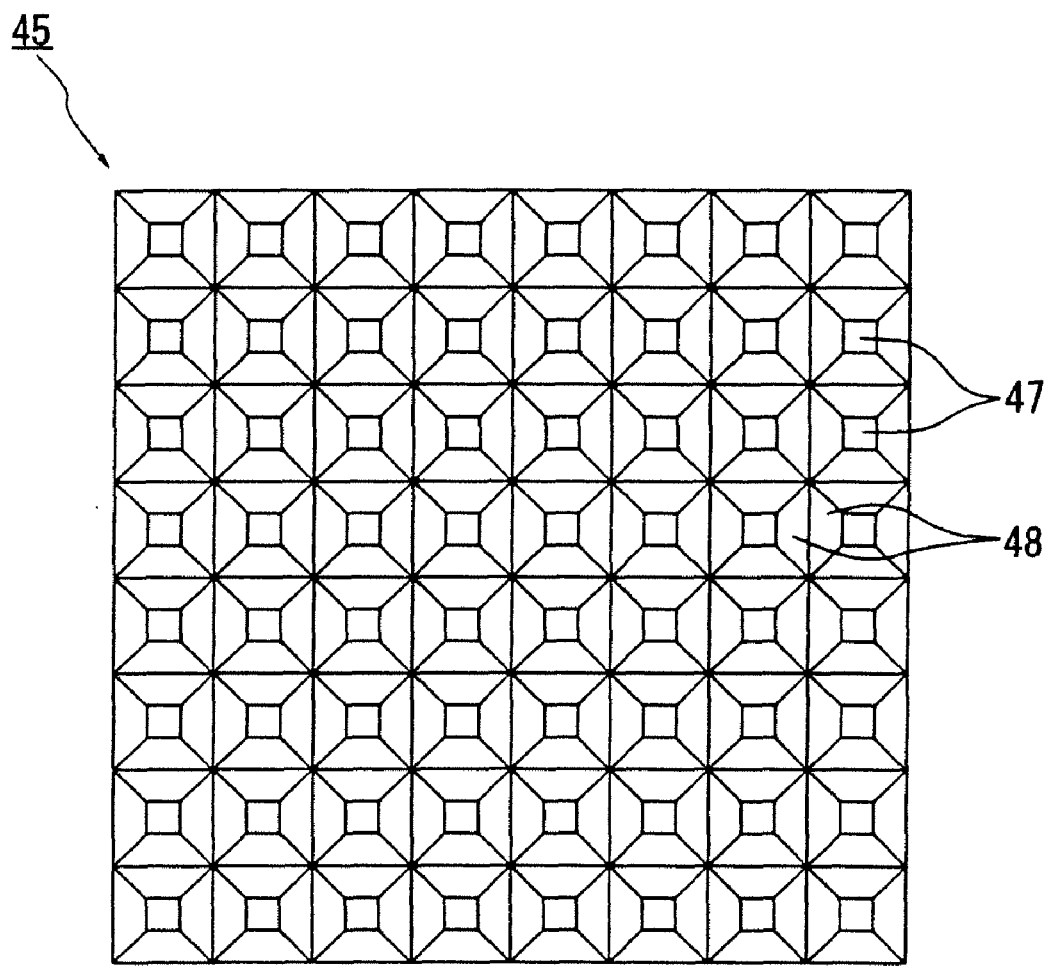
FIG. 4 is a bottom view showing a contact surface of a processing tool.

FIG. 4 is a bottom view showing a contact surface of the processing tool.

As shown in FIG. 4, the contact surface 46 of the processing tool 45 is provided with plural protrusions 47 protruding downward, and inclines 48 formed around each of the protrusions 47 and inclining upward. The protrusions 47 are each formed a flat square at the bottom surface and arranged at intervals in the horizontal and vertical directions. The inclines 48 are formed connecting to the protrusion 47 and inclined upward from the outer edge of the protrusion 47. Between two adjacent protrusions 48, the contact surface 46 is most concave or depressed at the association part of the inclines 48.

Effects of the First Embodiment

As described above, the light emitting device 1 is constructed such that the heat dissipation member 4 of aluminum that is difficult to bond to the solder material 3 is provided with the bonding portion 43 that is processed to be bonded to the solder material 3. Thus, the heat dissipation member 4 can be bonded via the solder material 3 to the light-emitting portion 2. Therefore, a fastening member such as a screw and a resin sheet for adhesion are not needed. As a result, the number of parts and the production steps can be decreased to reduce the production cost.

Conventionally, when the heat dissipation member is formed of copper that can be easy bonded by the solder material, a problem has arisen that the specific gravity becomes large to increase the weight of the device. Furthermore, the material cost per weight increases and the workability lowers since it is difficult to be molded by extrusion or die-casting. Thus, the light emitting device 1 of this embodiment can solve the problems.

The light emitting device 1 of this embodiment operates such that heat generated by the LED element 21 can be smoothly transferred through the mount portion 22 and the solder material 3 to the main body 41 of the heat dissipation member 4. Then, the heat can be dissipated in the air by being transferred from the main body 41 to the fins 42. In this regard, since no oxide film is formed at the bonding portion 43 of the heat dissipation member 4, the solder material 3 can be securely bonded to the main body 41 and the thermal resistance between the mount portion 22 and the main body 41 can be reduced. Thus, it is very advantageous in practical use. Also, the concavity and convexity formed on the bonding portion 43 can allow the secure bonding between the solder material 3 and the main body 41 such that the bonding portion 43 is less likely to peel from the main body 41. Thus, even when heat is generated from the LED element 21, the adhesion between the light-emitting portion 2 and the heat dissipation member 4 via the solder material 3 can be retained such that the light-emitting portion 2 is not separated from the heat dissipation member 4 during the operation and the thermal resistance between the light-emitting portion 2 and the heat dissipation member 4 does not increase with time. Therefore, high reliability can be secured.

In this embodiment the bonding portion 43 formed of copper diffused in aluminum is exemplified, but it may be formed of gold diffused in aluminum. In this case, a gold foil may be used in place of the copper foil and the bonding portion 43 may be formed by ultrasonic wave bonding. Further, the other metal than copper and gold may be diffused in aluminum that can be bonded to the solder material 3.

In this embodiment the heat dissipation member 4 formed of aluminum is exemplified, but it may be formed of aluminum alloys, magnesium or magnesium alloys. In other words, where the bonding portion 43 is composed such that a metal to be bonded to the solder material 3 is diffused in aluminum, aluminum alloys, magnesium or magnesium alloys, the same effects as those in this embodiment can be obtained.

Figure 5:
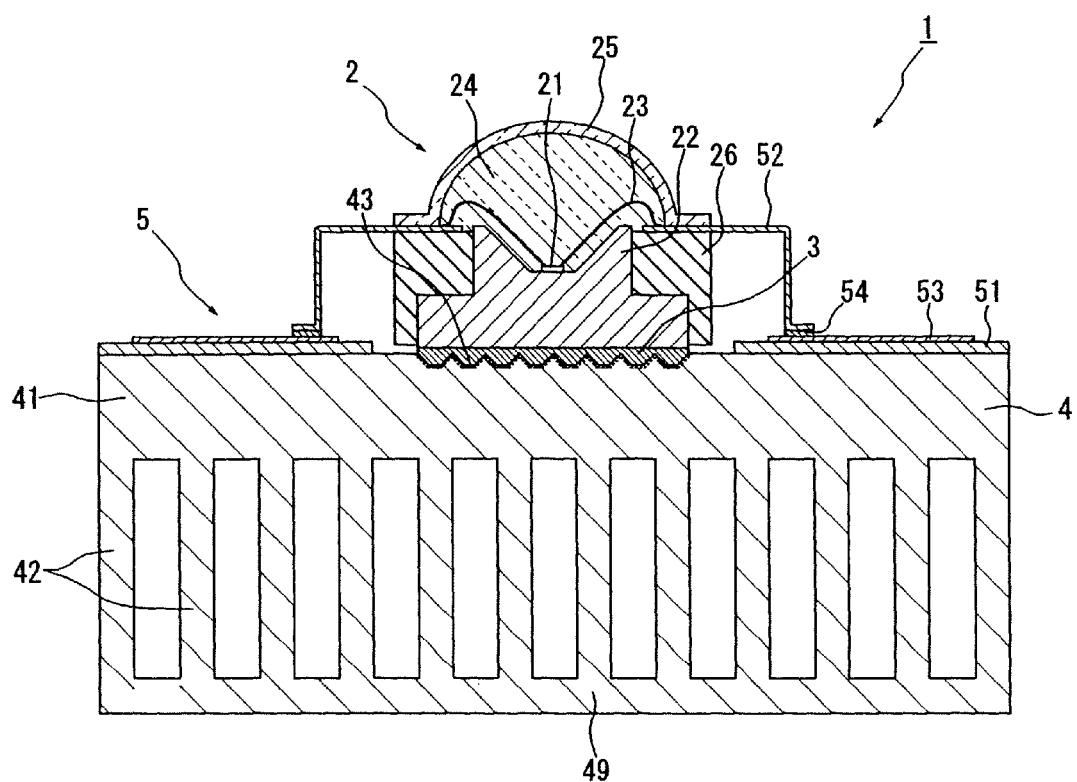
FIG. 5 is a cross sectional view showing a modification of the first embodiment.

In this embodiment the gap between the adjacent fins 42 of the heat dissipation member 4 being opened at the lower end is exemplified, but the lower end of the fins 42 may be connected by, e.g., a plate member 49 as shown in FIG. 5. Thus, by providing the plate member 49 covering the bonding portion 43 (separate from the main body 41) in the bottom view, ultrasonic wave emitted outside from the lower side of the main body 41 can be used by being reflected toward the bonding portion 43 by the plate member 49 during the ultrasonic bonding of the copper foil 44. Therefore, the ultrasonic bonding can be conducted efficiently. In this construction, even when not pressed by using the processing tool 45, the bonding portion 43 can be formed to be sufficiently available in practical use. In addition, the plate member 49 for connecting the fins 42 allows the rigidity of the heat dissipation member 4 to be significantly enhanced.

Figure 6:
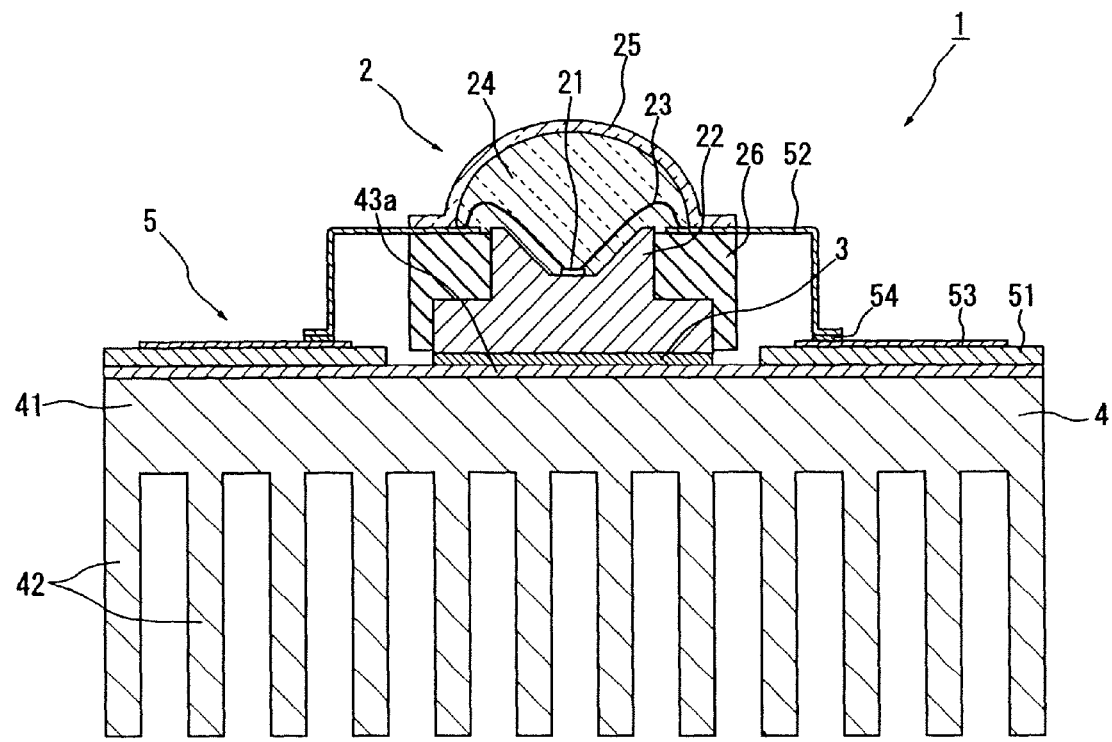
FIG. 6 is a cross sectional view showing another modification of the first embodiment.

In this embodiment the bonding portion 43 formed by ultrasonic bonding the copper foil 44 is exemplified, another bonding portion 43a may be formed by, e.g., zincate treatment substituting zinc (Zn) for aluminum in the heat dissipation member 41 to form zinc plated layer on the surface of the main body 41 as shown in FIG. 6. Since zinc is also relatively less likely to form oxide film thereon, even the bonding portion 43a formed of zinc plated layer can be bonded via the solder material 3 to the light-emitting portion 2. Other than the zinc plated layer, a plated layer formed of copper, nickel etc. may be used.

Second Embodiment

Figure 7:
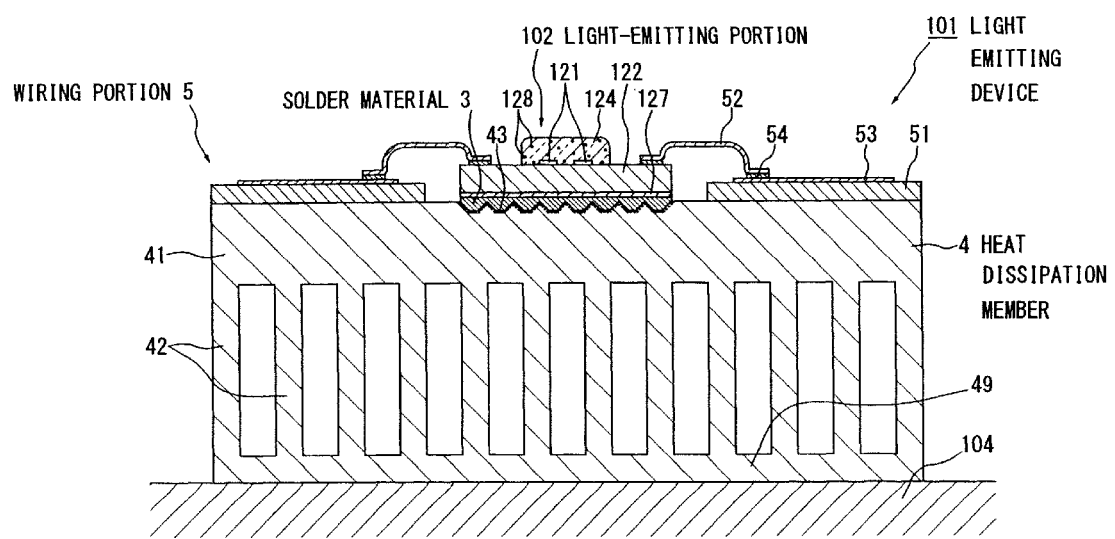
FIG. 7 is a cross sectional view showing a light emitting device in a second preferred embodiment according to the invention.

FIG. 7 is a cross sectional view showing a light emitting device in the second preferred embodiment according to the invention.

As shown in FIG. 7, the light emitting device 101 is composed of a light-emitting portion 102 including LED (light-emitting diode) elements 121 etc., the heat dissipation member 4 connected via the solder material 3 to the light-emitting portion 102, and the wiring portion 5 for feeding power to the light-emitting portion 102. The wiring portion 5 includes the glass epoxy substrate 51 mounted on the heat dissipation member 4, and the lead 52 for connecting the glass epoxy substrate 51 and the light-emitting portion 102.

The light-emitting portion 102 is composed of the plural LED elements 121 for emitting light with a predetermined wavelength, a mount portion 122 for mounting the LED element 121 thereon, a sealing portion 124 for sealing the LED element 121 on the mount portion 122.

The LED elements 121 are each of flip-chip (or face-down) type and have a p-electrode and an n-electrode at the bottom surface. The LED elements 121 which are arranged four in total and two each in the height and width directions are mounted on the mount portion 122.

The mount portion 122 is a ceramic substrate, and a metal layer able 127 to be bonded to the solder material 3 is formed on the entire bottom surface. In this embodiment, the mount portion 122 is the ceramic substrate formed of AlN (with a thermal expansion coefficient of $5 \times 10^{-6}$° C.) and the metal layer 127 is of copper. Although not shown in FIG. 7, a circuit pattern is formed on the mount surface of the mount portion 122 for the LED elements 121.

The sealing portion 124 is formed of a transparent sol-gel glass (with a thermal expansion coefficient of $6 \times 10^{-6}$° C.), and includes a phosphor 128 for emitting a wavelength-converted light by being excited by light emitted from the LED element 121. In this embodiment, the LED element 121 each emit blue light and the phosphor 128 emits yellow light by the exciting blue light, so that the blue light and the yellow light can be mixed to produce white light. Where the LED elements 121 are each composed of a semiconductor material represented by $In_xAl_yGa_{1-x-y}N$ ($0 \leq x \leq 1$, $0 \leq y \leq 1$, $0 \leq x+y \leq 1$) and a substrate with a refractive index nearly equal to that of the semiconductor material, the sealing portion 124 is desirably formed of glass with a refractive index of not less than 1.6.

The heat dissipation member 4 is formed of aluminum (with a thermal expansion coefficient of $23 \times 10^{-6}/°$ C.), and composed of the main body 41 for connecting the light-emitting portion 102 via the solder material 3, the plural fins 42 protruding from the main body 41, the bonding portion 43 at the center of the top surface, and the plate member 49 for connecting the lower end of the fins 42. The plate member 49 is surface-contacted with a metal member 104 at the bottom surface. The bonding portion 43 is formed on the main body 41 by using ultrasonic wave while applying a load to the copper foil 44 by using the processing tool 45 as described earlier. The thermal expansion coefficient of copper is $16 \times 10^{-6}/°$ C., so that the bonding portion 43 as a blend of aluminum and copper can have a thermal expansion coefficient between that of the main body 41 and that of the mount portion 122.

The material of the solder material 3 may be arbitrary. For example, it may be Sn—Sb based solder, Sn—Cu based solder, Sn—Ag based solder, Sn—Zn base solder, Sn—Bi based solder etc.

The glass epoxy substrate 51 is mounted on the main body 41 of the heat dissipation member 4 and provided with the circuit pattern 53 thereon. One end of the lead 52 is connected via the solder material 54 to the circuit pattern 53, and the other end thereof is connected to the circuit pattern on the mount portion 122.

Effects of the Second Embodiment

As described above, the light emitting device 101 is composed such that the heat dissipation member 4 of aluminum that is difficult to bond to the solder material 3 is provided with the bonding portion 43 that is processed to be bonded to the solder material 3. Thus, the heat dissipation member 4 can be bonded via the solder material 3 to the light-emitting portion 2. Heat generated by the LED elements 121 can be smoothly transferred through the mount portion 122 and the solder material 3 to the main body 41 of the heat dissipation member 4. In this regard, since no oxide film is formed at the bonding portion 43 of the heat dissipation member 4, the solder material 3 can be securely bonded to the main body 41 and the thermal resistance between the mount portion 122 and the main body 41 can be reduced. Thus, it is very advantageous in practical use. Thus, even when heat is generated from the LED element 121, the adhesion between the light-emitting portion 102 and the heat dissipation member 4 via the solder material 3 can be retained such that the light-emitting portion 102 is not separated from the heat dissipation member 4 during the operation and the thermal resistance between the light-emitting portion 102 and the heat dissipation member 4 does not increase with time. Therefore, high reliability can be secured.

Owing to heat transfer conducted between the metal members without oxide film on the surface, the light emitting device 101 can be rendered small in thermal resistance and compact without increasing the contact area. In order to suppress the influence on thermal resistance by the surface oxide film, it is effective to increase the contact area between the heat dissipation member 4 and the heat-generating side. However, if the contact area increases, a problem may arise that the light emitting device 101 cannot be made compact. In accordance with the embodiment, the light emitting device 101 can be rendered compact without increasing the contact area. This is advantageous especially in case of the high-power light-emitting portion 102. On the other hand, where the mount portion 122 is formed of ceramic whose difference from aluminum in thermal expansion coefficient is large and which is relatively liable to crack, the mount portion 122 is desirably to be designed compact or downsized for reducing the stress or the cost. In this regard, the light emitting device 101 of the embodiment can secure the heat dissipation performance even when the contact area is reduced by compact design or downsizing.

The thermal expansion coefficient of the bonding portion 43 is set to fall between those of the mount portion 122 and the heat dissipation member 4, respectively. Therefore, even when thermal expansion/contraction occurs at each part due to heat generation of the LED elements 121, the bonding portion 43 can function as a buffer to reduce the thermal stress. Thereby, even when the mount portion 122 is formed of ceramic relatively liable to crack, the mount portion 122 can be prevented from cracking since the internal thermal stress of the mount portion 122 can be reduced or buffered as above. The bonding portion 43 is formed by diffusing copper into aluminum by the ultrasonic wave application so that the bonding portion 43 is less likely to peel therefrom. The contact area between the mount portion 122 and the heat dissipation member 4 via the solder material 3 can be increased.

The plate member 49 of the heat dissipation member 4 is surface-contacted with the metal member 104 such that the contact area between the heat dissipation member 4 and the metal member 104 can be increased to surely transfer heat of the heat dissipation member 4 to the metal member 104. Here, since the contact area between the heat dissipation member 4 and the metal member 104 is large, no problem occurs in heat transfer even when the thermal resistance therebetween is relatively high due to the oxide film. Further, the sealing portion 124 is formed of an inorganic material about one tenth of the resin in thermal expansion coefficient so that it is less likely to peel due to thermal expansion/contraction since the thermal expansion coefficient thereof is equivalent to the mount portion 122 and relatively low.

In the second embodiment the bonding portion 43 is formed by ultrasonic wave bonding of copper, but it may be formed by zinc plating. In this case, Ni plated layer (2 to 5 μm thick and $13 \times 10^{-6}/°$ C. in thermal expansion coefficient) and Au plated layer (0.02 to 0.05 μm thick and $14 \times 10^{-6}/°$ C. in thermal expansion coefficient) may be further formed on the Zn plated layer (50 to 500 Å and about $30 \times 10^{-6}/°$ C. in thermal expansion coefficient) such that the thermal stress buffering function of the bonding portion 43 can be enhanced and the surface corrosion can be more effectively prevented. Meanwhile, the Ni plating and Au plating may be replaced by the other metal on the condition that the thermal expansion coefficient of the metal falls between those of the mount portion 122 and the heat dissipation member 4, and the number, thickness etc. of plated layers may be determined suitably. However, since the thermal expansion coefficient of Zn is about $30 \times 10^{-6}/°$ C., the total thermal expansion coefficient of the bonding portion 43 is desirably less than that of the heat dissipation member 4 for reducing the thermal stress. Further, the total thickness of the bonding portion 43 is desirably not less than 1 μm for reducing the thermal stress.

The mount portion 122 may be of a semiconductor material such as silicon other than ceramics. Silicon (3 to $5 \times 10^{-6}/°$ C. in thermal expansion coefficient) is 100 W/mK or more in thermal conductivity and lower than AlN in price.

Third Embodiment

Figure 8:
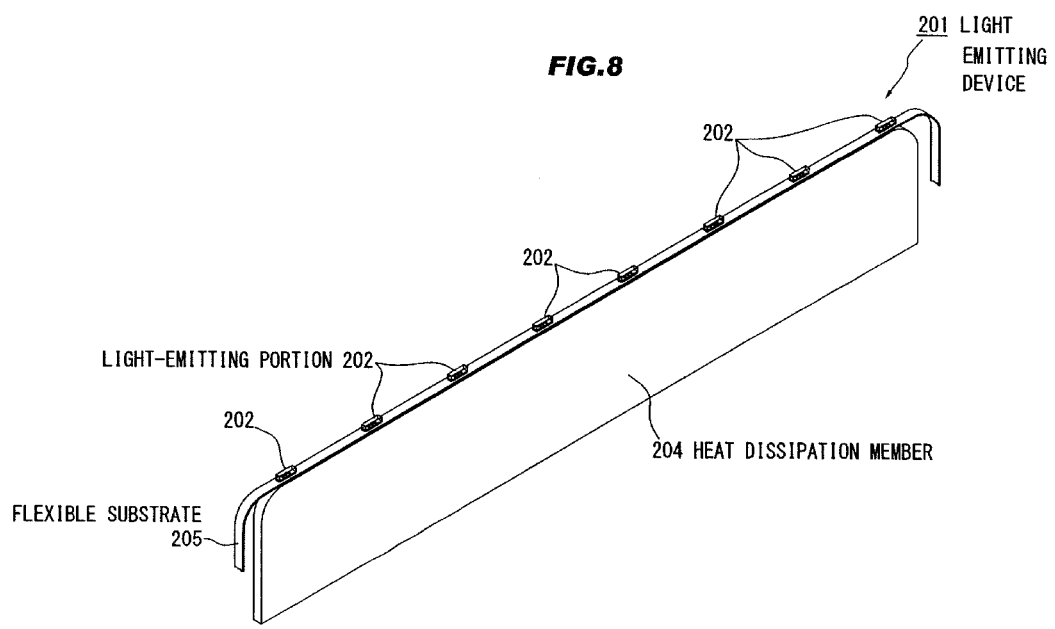
FIG. 8 is a perspective view showing a light emitting device in a third preferred embodiment according to the invention.
Figure 9:
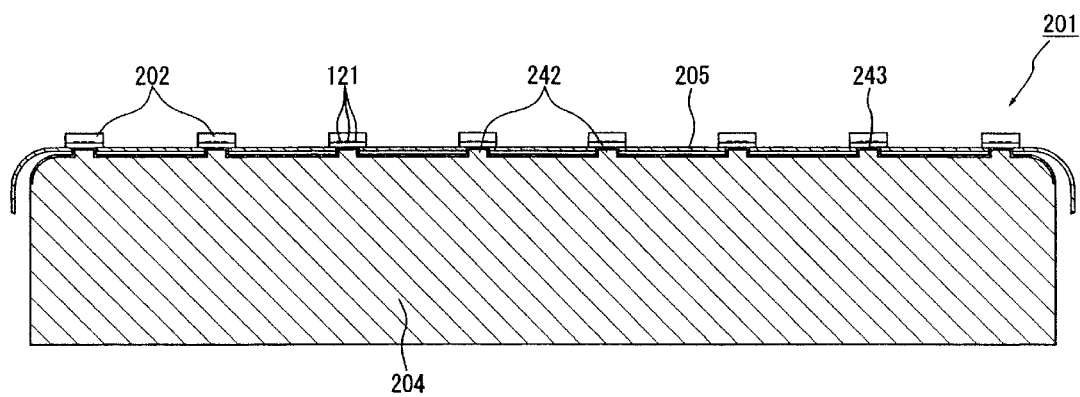
FIG. 9 is a cross sectional view showing the light emitting device in FIG. 8.
Figure 10:
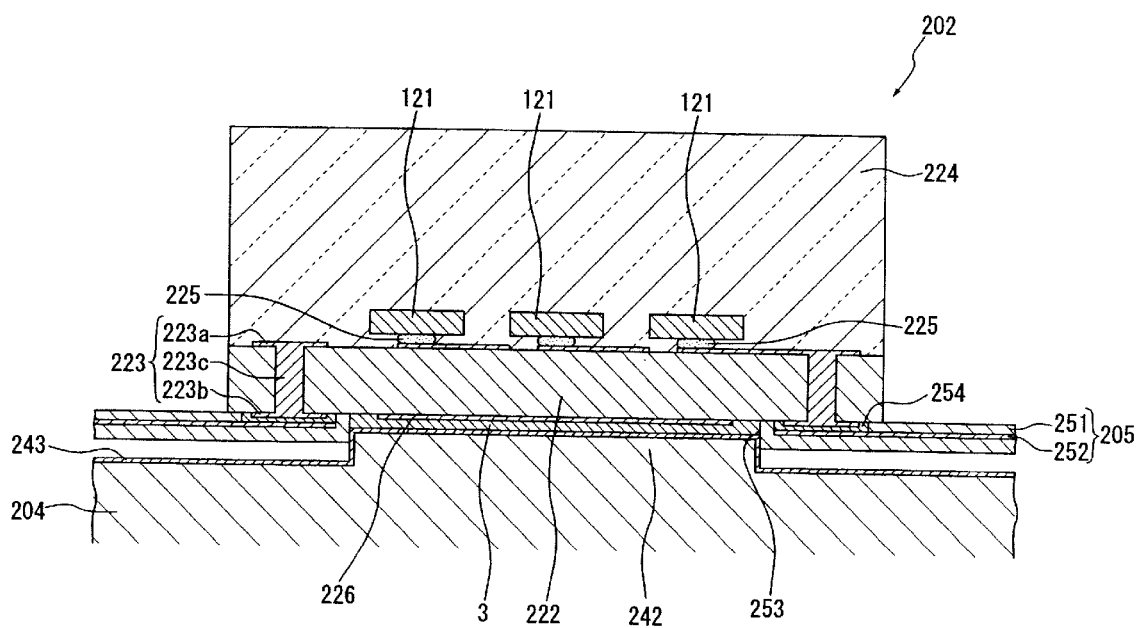
FIG. 10 is an enlarged cross sectional view showing a light-emitting portion and its vicinity in FIG. 8.

FIGS. 8 to 10 show the third preferred embodiment of the invention. FIG. 8 is a perspective view showing a light emitting device in the third embodiment according to the invention.

As shown in FIG. 8, the light emitting device 201 is composed of plural light-emitting portions 202 including the LED elements 121, a heat dissipation member 204 connected via the solder material 3 to the light-emitting portions 202, and a flexible substrate 205 for feeding power to the light-emitting portions 202. The heat dissipation member 204 is formed of aluminum and formed into a plate. The light-emitting portions 202 are formed at intervals on the top surface of the heat dissipation member 204.

FIG. 9 is a cross sectional view showing the light emitting device in FIG. 8.

As shown in FIG. 9, in this embodiment, the eight light-emitting portions 202 in total are electrically in series mounted on the flexible substrate 205. The light-emitting portions 202 each include the three LED elements 121 connected electrically in series. The LED elements 121 each emit light with a peak wavelength of 460 nm at forward voltage of 4.0 V and at forward current of 100 mA. In other words, the light emitting device 201 has the twenty-four LED elements 121 in total are in series connected such that forward voltage of about 4.0 V is applied to each of the LED elements 121 when using a domestic power source of AC 100 V, whereby the LED elements 121 operates regularly.

On the top end of the heat dissipation member 204, plural protrusions 242 protruding upward are formed at intervals. On the protrusion 242, the light-emitting portion 202 is mounted via the solder material 3. The entire top end of the heat dissipation member 204 is Zn plated, and Zn plated bonding portion 243 is formed on the protrusion 242.

FIG. 10 is an enlarged cross sectional view showing a light-emitting portion and its vicinity in FIG. 8.

As shown in FIG. 10, the light-emitting portion 202 is composed of plural flip-chip type LED elements 121, a mount portion 222 of ceramic and for mounting the LED elements 121, a circuit pattern 223 formed on the mount portion 222 for feeding power to the LED elements 121, a glass sealing portion 224 for sealing the LED elements 121 on the mount portion 222, and bumps 225 disposed between the LED element 121 and the circuit pattern 223.

The mount portion 222 is of alumina ($Al_2O_3$) polycrystalline sintered material, and the circuit pattern 223 is composed of an upper pattern 223a formed on the top surface of the mount portion 222 and electrically connected to the LED element 121, an electrode pattern 223b formed on the bottom surface of the mount portion 222 and electrically connected to the flexible substrate 205, and a via pattern 223c for connecting electrically the upper pattern 223a and the electrode pattern 23b. Between the electrode patterns 223b on the bottom surface of the mount portion 222, a heat dissipation pattern 226 of copper is formed.

The glass sealing portion 224 is formed of $ZnO$—$B_2O_3$—$SiO_2$—$Nb_2O_5$—$Na_2O$—$Li_2O$ based molten glass (heat melt glass) and formed into a rectangular solid on the mount portion 222. The molten glass is 490° C. in glass transition temperature (Tg), 520° C. in yielding point (At), $6 \times 10^{-6}$/° C. in thermal expansion coefficient ($\alpha$) at 100 to 300° C., and 1.7 in refractive index. The composition of the molten glass is not limited to above, and the molten glass may not include $Li_2O$ or may include $ZrO_2$, $TiO_2$ etc. as an arbitrary component. Alternatively, the glass sealing portion 224 may be formed of a sol-gel glass derived from a metal alkoxide.

The light-emitting portion 202 is produced such that the plural LED elements 121 are mounted on a ceramic substrate for the mount portion 222, the LED elements 121 are sealed together with glass, and the sealed is separated into the plural light-emitting portions 202 by dicing. By the dicing, the sides of the glass sealing portion 224 are formed. In this method, many LED elements 121 can be mounted on the ceramic substrate, so that the mounting, sealing and dicing etc. of the LED elements 121 can be conducted efficiently and the material cost can be reduced due to the small device. Thus, the method is advantageous in mass production. However, due to the small device, new problems occur that heat generated at the light-emitting portion 202 needs to be transferred efficiently to the heat dissipation member 204 and lateral light increases that is radiated from the side face of the glass sealing portion 224.

The flexible substrate 205 is composed of an insulating portion 251 formed of polyimide, liquid-crystal polymer etc., and a circuit pattern 252 formed in the insulating portion 251. The circuit pattern 252 of the flexible substrate 205 is exposed from the insulating portion 251 at the connection part to the light-emitting portion 202, and is connected via a solder material 254 to the circuit pattern 223 of the light-emitting portion 202. The flexible substrate 205 has a hole 253 through which the protrusion 242 of the heat dissipation member 204 is inserted and the solder material 3 is filled in the hole 253. The connection part to the light-emitting portion 202 of the flexible substrate 205 is not fixed to the heat dissipation member 204 for preventing the electrical connection failure that may be caused by the thermal stress.

Effects of the Third Embodiment

As described above, the light emitting device 201 is constructed such that the heat dissipation member 204 of aluminum that is difficult to bond to the solder material 3 is provided with the bonding portion 243 that is processed to be bonded to the solder material 3. Therefore, the heat dissipation member 204 can be bonded via the solder material 3 to the light-emitting portion 202. Heat generated from the LED elements 121 during the operation is smoothly transferred through the mount portion 222 and the solder material 3 to the heat dissipation member 204. In this regard, since no oxide film is formed at the bonding portion 243 of the heat dissipation member 204, the solder material 3 can be securely bonded to the protrusion 242 of the heat dissipation member 204 and the thermal resistance between the mount portion 222 and the protrusion 242 can be reduced. Thus, it is very advantageous in practical use. Thus, even when heat is generated from the LED element 121, the adhesion between the light-emitting portion 202 and the heat dissipation member 204 via the solder material 3 can be retained such that the light-emitting portion 202 is not separated from the heat dissipation member 204 during the operation and the thermal resistance between the light-emitting portion 202 and the heat dissipation member 204 does not increase with time. Therefore, high reliability can be secured. It is confirmed by the inventors that the light-emitting portion 202 of 0.75 mm in width, 2.6 mm in length and 0.85 mm in height can be bonded to the heat dissipation member 204 of 1.2 mm in width and 90 mm in total length at a low thermal resistance of not more than 2.5° C./W.

Modifications

Figure 11A:
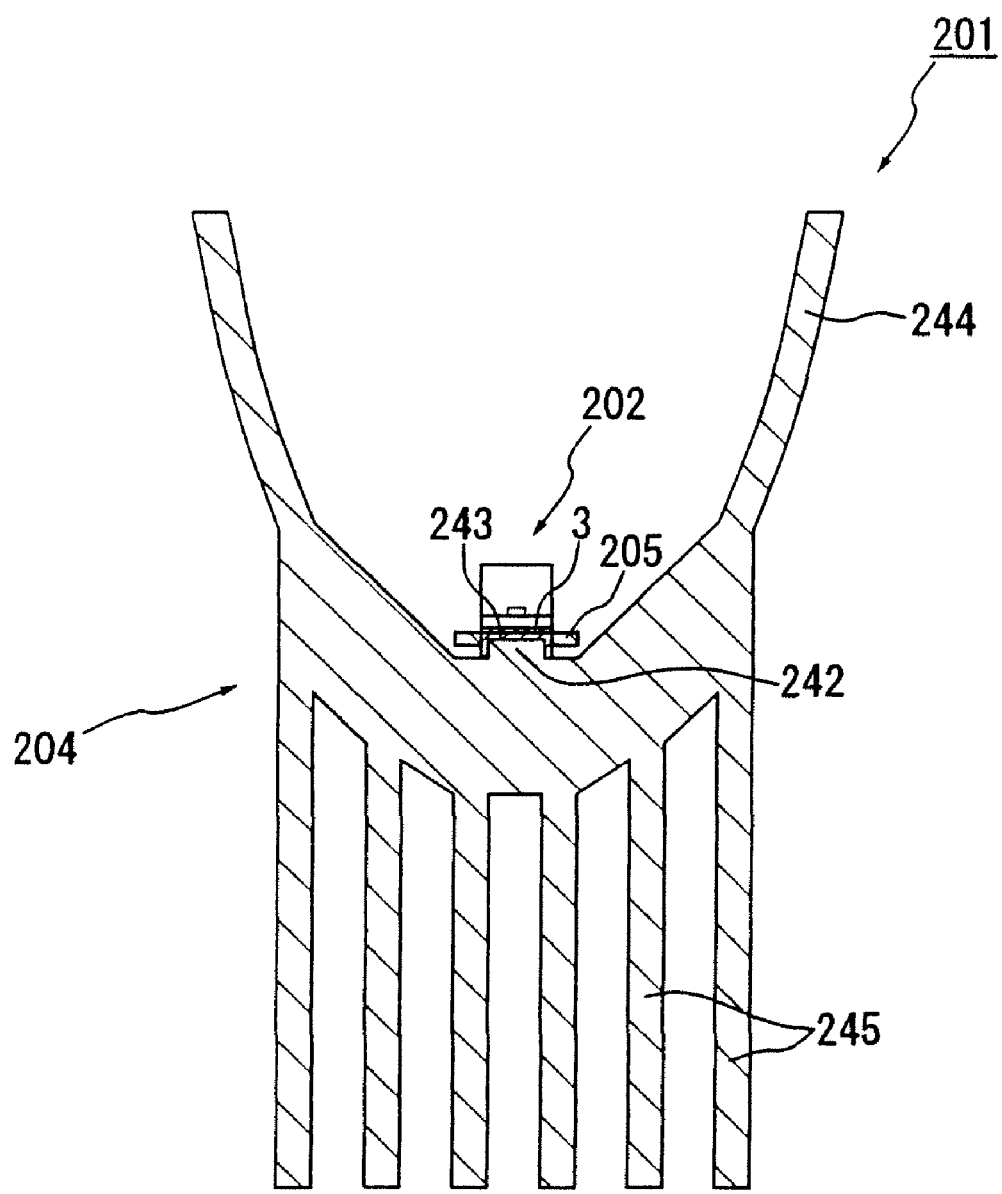
FIG. 11A is a front cross sectional view showing a light emitting device in a modification of the third embodiment.

In the third embodiment the heat dissipation member 204 is formed into a plate, but the heat dissipation member 204 may be provided with a reflecting mirror 244 and fins 245 as exemplified in FIGS. 11A and 11B. FIG. 11A is a front cross sectional view showing a light emitting device in a modification of the third embodiment. FIG. 11B is a side cross sectional view showing the light emitting device in FIG. 11A.

As shown in FIG. 11A, the heat dissipation member 204 of the light emitting device 201 is composed of the reflecting mirror 244 opened upward and U-shaped, and the plural fins 245 extending downward. The protrusion 242 protruding upward is formed at the bottom of the reflecting mirror 244, and the light-emitting portion 202 is mounted on the protrusion 242. As shown in FIG. 11B, the reflecting mirror 244 and the fins 245 of the heat dissipation member 204 extend in the alignment direction of the light-emitting portions 202 and each have the same cross section along the longitudinal direction of the device. The light emitting device 201 is constructed such that the bonding portion 243 with no oxide film formed thereon can be relatively easy formed in a narrow space inside the reflecting mirror 244 and a small light-focusing light source can be obtained by making the light-emitting portion 202 and the reflecting mirror 244 close to each other. Thus, while removing the surface oxide film and not increasing the contact area, the light-emitting portions 202 can be bonded to the heat dissipation member 204 at a low thermal resistance such that no restriction is applied to the shape of the reflecting mirror 244. Therefore, the heat dissipation member 204 with the reflecting mirror and the fins integrated can be used. In particular, this is advantageous when the bottom part of the reflecting mirror 244 is narrowed by widening the opening of the reflecting mirror 244 relative to the bottom.

Figure 12A:
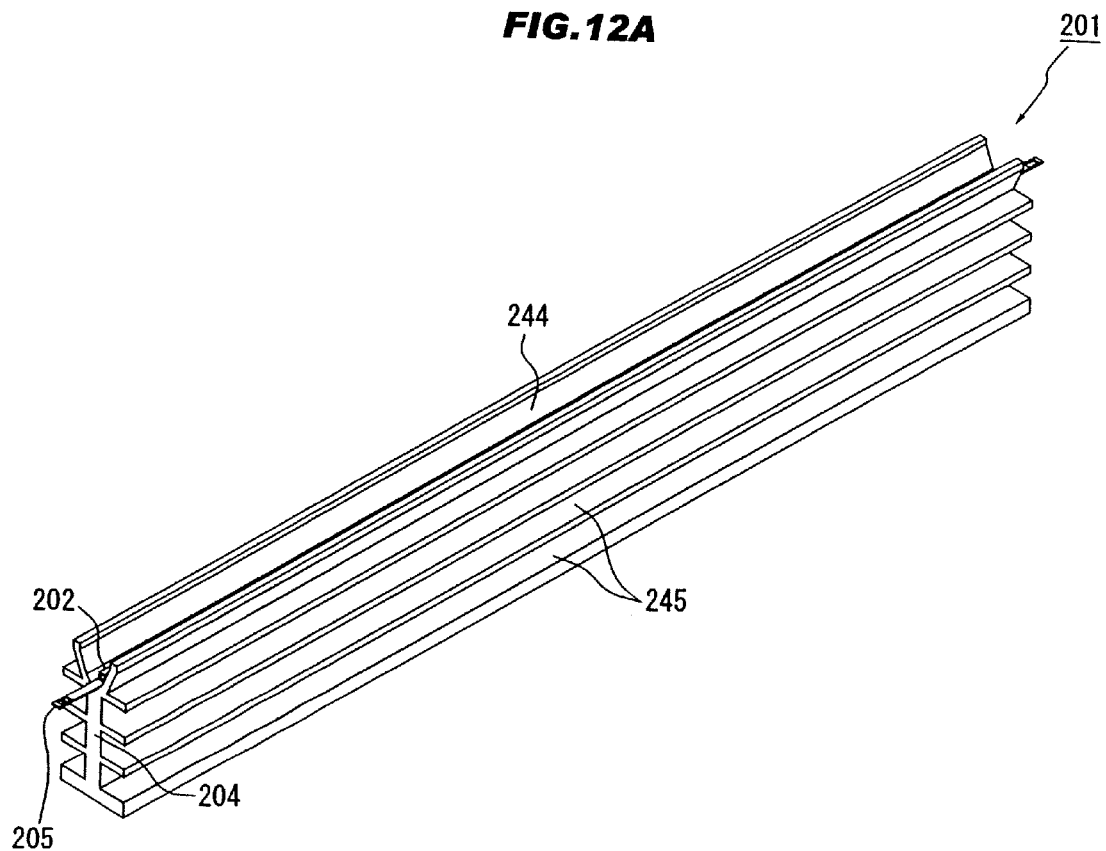
FIG. 12A is a perspective view showing a light emitting device in another modification of the third embodiment.

Alternatively, as shown in FIG. 12A, the heat dissipation member 204 of the light emitting device 201 may be composed of a reflecting mirror 244 opened upward and U-shaped, and the plural fins 245 extending outside in the horizontal (width) direction. At the bottom of the reflecting mirror 244, the plural light-emitting portions 202 are mounted in alignment. As shown in FIG. 12A, the reflecting mirror 244 and the fins 245 of the heat dissipation member 204 extend in the alignment direction of the light-emitting portions 202 and each have the same cross section along the longitudinal direction of the device. The light emitting device 201 as above is constructed such that the bonding portion 243 with no oxide film formed thereon can be relatively easy formed in a narrow space inside the reflecting mirror 244 and a small light-focusing light source can be obtained by making the light-emitting portion 202 and the reflecting mirror 244 close to each other.

Figure 12B:
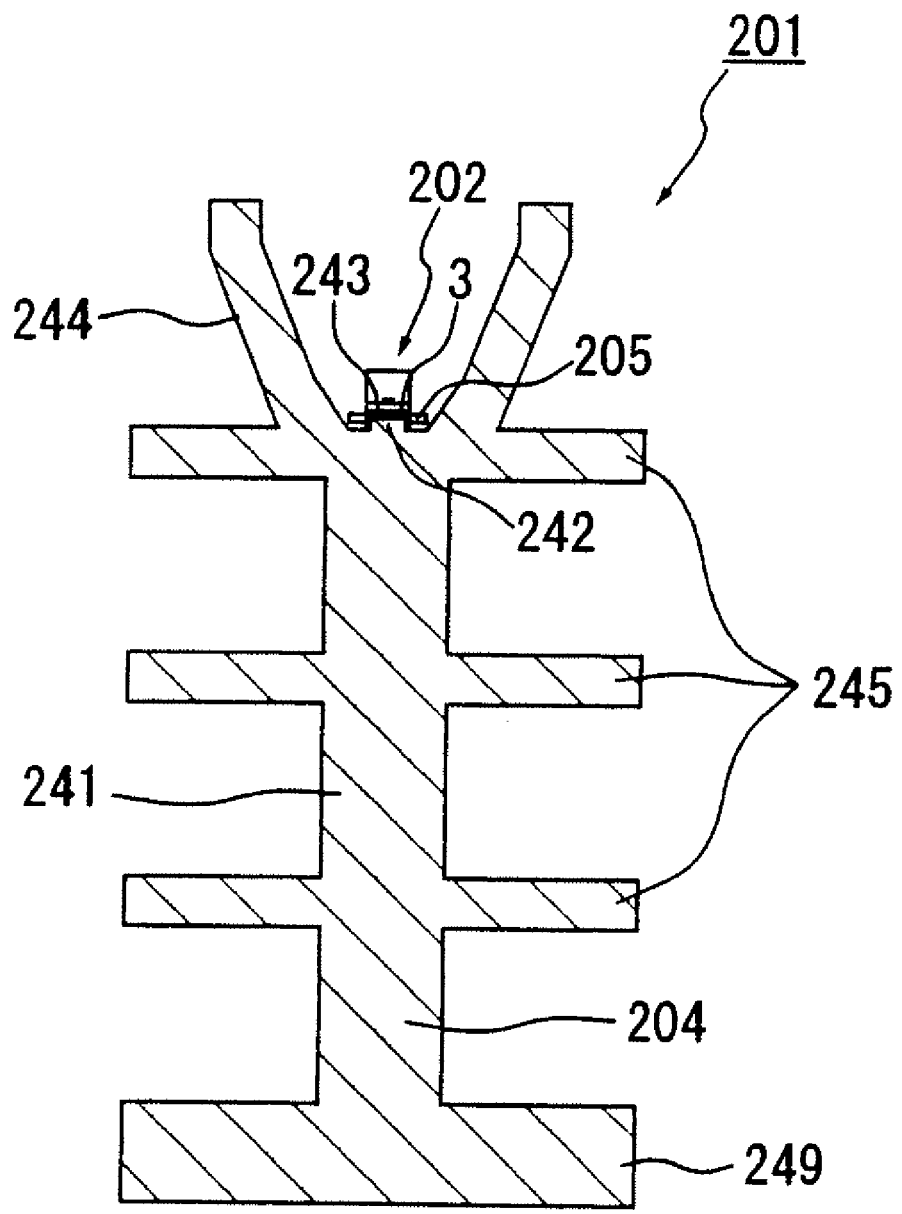
FIG. 12B is a front cross sectional view showing the light emitting device in FIG. 12A.

As shown in FIG. 12B, the light emitting device 201 is constructed such that heat generated at the light-emitting portions 202 is transferred through a main body 241 of the heat dissipation member 204 extending vertically to the plate member 249 at the bottom side. The thickness of the main body 241 in the width direction is to be set taking into consideration that the temperature difference between the bonding portion 243 for mounting the light-emitting portions 202 and the plate member 249 is not too big. For example, (L/S)× W/k is to be not more than 10° C., desirably not more than 5° C., where the amount of heat generation of the light-emitting portions 202 is W, the length and area in the vertical direction of the main body 241 are L and S, respectively, and the thermal conductivity of the heat dissipation member 204 is k. The fins 245 extending outside from the main body 241 in the width direction are disposed three plates in the vertical direction, and the gap between two plates and the dimensions are set so as not to interrupt the convention of the air heated by the fins 245. The dimensions of the plate member 249 are set taking into consideration that when the bottom surface thereof contacts the other member, heat can be sufficiently transferred to the other member to reduce the temperature rise of the plate member 249.

FIG. 12C is a table showing experimental result data in Invention Example, Comparative Example 1 and Comparative Example 2.

As Invention Example, the light emitting device 201 is produced such that the eight light-emitting portions 202 each including the three LED elements 121 are bonded via solder material 3 to the bonding portion 243 of the heat dissipation member 204, and data of Invention Example was obtained. The whole heat dissipation member 204 is 100 mm in the longitudinal direction, 10 mm in the width direction, and 20 mm in the vertical direction. The main body 241 extending vertically is 2.5 mm in the width direction and 15.5 mm in the vertical direction. On both outer surfaces of the main body 241 in the width direction, the fins 245 each of which is 100 mm in the longitudinal direction, 3.75 mm in the width direction, and 1.00 mm in the vertical direction are disposed three plates at intervals of 4.5 mm in the vertical direction. The shape of the heat dissipation member 204 is the same as the light emitting device 201 shown in FIG. 12A. The contact area of the solder material 3 and the heat dissipation member 204 is 0.78 mm$^2$, which is given by multiplying 1.3 mm in the longitudinal direction of the light-emitting portion 202 by 0.6 mm in the width direction thereof. In FIG. 12C, for Invention Example, the total amount of electric power fed to the light-emitting portions 202 and the temperature difference between the light-emitting portions 202 and the fins 245 are shown.

As Comparative Example 1, a light emitting device is produced such that the three light-emitting portions 202 including the twenty-four LED elements 121 are used, each of the light-emitting portions 202 is bonded via the solder material 3 to the copper slag, and the copper slag is fixed by screws to the heat dissipation member 204, and data of Comparative Example 1 was obtained. For example, the contact area of the copper slag and the heat dissipation member 204 is 900 mm$^2$, which is given by multiplying 18 mm in the longitudinal direction of the light-emitting portions 202 by 50 mm in the width direction thereof. The mounting portion 204 is the same as that of Invention Example. In FIG. 12C, for Comparative Example 1, the total amount of electric power fed to the light-emitting portions 202 and the temperature difference between the light-emitting portions 202 and the fins 245 are shown.

As Comparative Example 2, a light emitting device is produced such that heat dissipation grease is coated between the copper slag of Comparative Example 1 and the heat dissipation member 204, and data of Comparative Example 2 was obtained. In FIG. 12C, for Comparative Example 2, the total amount of electric power fed to the light-emitting portions 202 and the temperature difference between the light-emitting portions 202 and the fins 245 are shown. Here, the emission energy efficiency of the light-emitting portions 202 is 20 to 30%, and the amount of heat generation is given by subtracting an amount converted into light (emission energy) from the fed power.

Figure 12D:
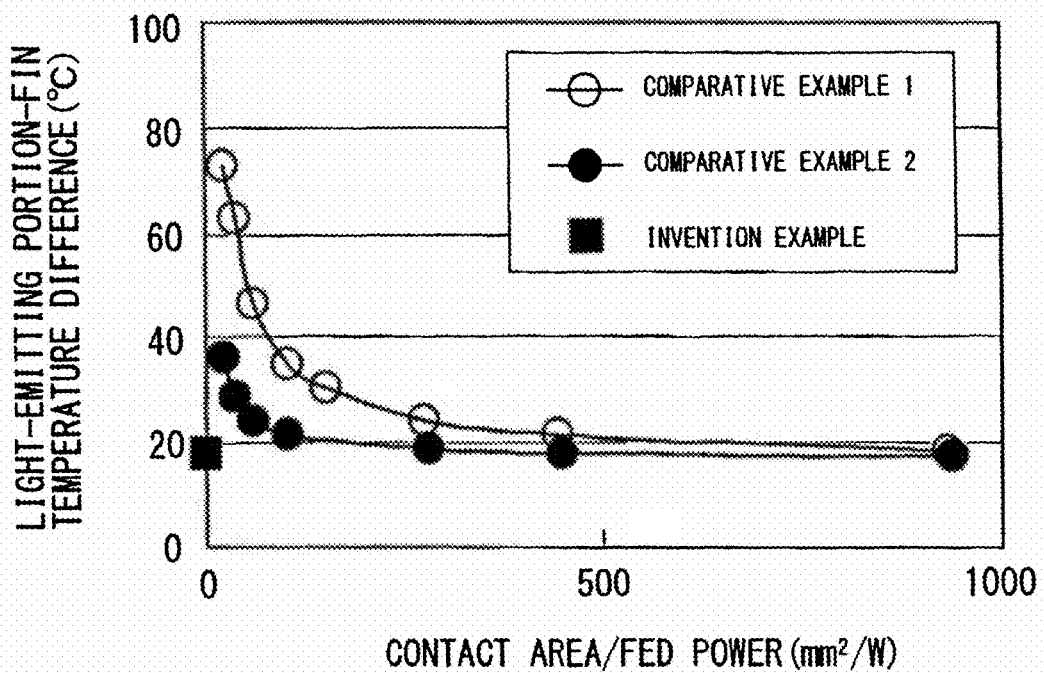
FIG. 12D is a graph comparing data in Invention Example, Comparative Example 1 and Comparative Example 2 where a horizontal axis indicates contact area/fed power and a vertical axis indicates a light-emitting portion-fin temperature difference.

FIG. 12D is a graph comparing data in Invention Example, Comparative Example 1 and Comparative Example 2 where a horizontal axis indicates contact area/fed power and a vertical axis indicates a light-emitting portion-fin temperature difference.

As seen from data of Comparative Example 1 shown in FIG. 12D, even by using the screw fastening, the temperature rise of the fins 245 can be suppressed if the contact area per fed power is sufficiently big. However, in Comparative Example 1, when the contact area per fed power decreases to 500 mm$^2$/W or less, the temperature difference between the light-emitting portions 202 and the fins 245 increases. In other words, when contact area per fed power decreases, heat generated at the light-emitting portions 202 becomes difficult to transfer to the fins 245. As seen from data of Comparative Example 2 shown in FIG. 12D, even by using the heat dissipation grease, heat generated at the light-emitting portions 202 becomes difficult to transfer to the fins 245 when the contact area per fed power decreases to 100 mm$^2$/W or less.

By contrast, in Invention Example, even when contact area per fed power is at about 1.0 mm$^2$/W, heat generated at the light-emitting portions 202 can be smoothly transferred to the fins 245. Thus, by directly bonding the solder material 3 to the bonding portion 243 of the heat dissipation member 204, it is possible to lower or eliminate the thermal resistance at the bonding site of the members. Invention Example is significantly effective at 500 mm$^2$/W or less relative to Comparative Example 1, and significantly effective at 100 mm$^2$/W or less relative to Comparative Example 2 using the heat dissipation grease.

Here, as in the light emitting device 201 shown in FIG. 12A, when the reflecting mirror 244 is provided with the heat dissipation member 204 for covering the light-emitting portions 202 from outside, the contact area between the light-emitting portions 202 and the heat dissipation member 204 becomes relatively small. Thus, the thermal resistance of the bonding portion 243 between the light-emitting portions 202 and the heat dissipation member 204 becomes predominant. However, by mounting the light-emitting portions 202 on the bonding portion 243 via the solder material 3, the temperature rise due to the thermal resistance can be suppressed.

On the other hand, the light emitting device 201 with the ceramic mount portion 222 used as a mount substrate is likely to occur a soldering crack by the thermal stress. When the heat dissipation member 204 is formed of aluminum, the heat dissipation member 204 has a thermal expansion coefficient greater than copper. Thus, the thermal expansion coefficient difference between the mount substrate and the heat dissipation member 204 becomes larger than the construction that it is bonded to copper. However, it is confirmed by the experiments of the inventors that the soldering crack can be prevented by setting to be not more than 0.2 μm/° C. the product of the thermal expansion coefficient difference between the heat dissipation member 204 and the mount substrate of the light-emitting portion 202 and the length (in the longitudinal direction) of the top end of the main body of the heat dissipation member 204 in the heat dissipation pattern 226 of the light-emitting portion 202. The solder material 3 is of Sn—Ag—Cu solder. The product is further preferably not more than 0.09 μm/° C. The product for the light emitting device 201 as shown in FIG. 12A is obtained 0.02 μm/° C. For example, where the thermal expansion coefficient of the heat dissipation member 204 is 23×10$^{-6}$/° C., the thermal expansion coefficient of the mount substrate is 7×10$^{-6}$/° C., and the length of the heat dissipation pattern 226 in the longitudinal direction is 12.8 mm, 0.2048 μm/° C. is the product of the thermal expansion coefficient difference between the heat dissipation member 204 and the mount substrate of the light-emitting portions 202 and the length (in the longitudinal direction) of the heat dissipation pattern 226 of the light-emitting portion 202. In this case, as the result of −40° C. to 100° C. liquid-phase thermal shock test, no crack occurs at 1000 cycles and a crack occurs at 3000 cycles. By contrast, when the length (in the longitudinal direction) of the heat dissipation pattern 226 is 5.6 mm or 1.3 mm, no crack occurs even at 3000 cycles.

Figure 12E:
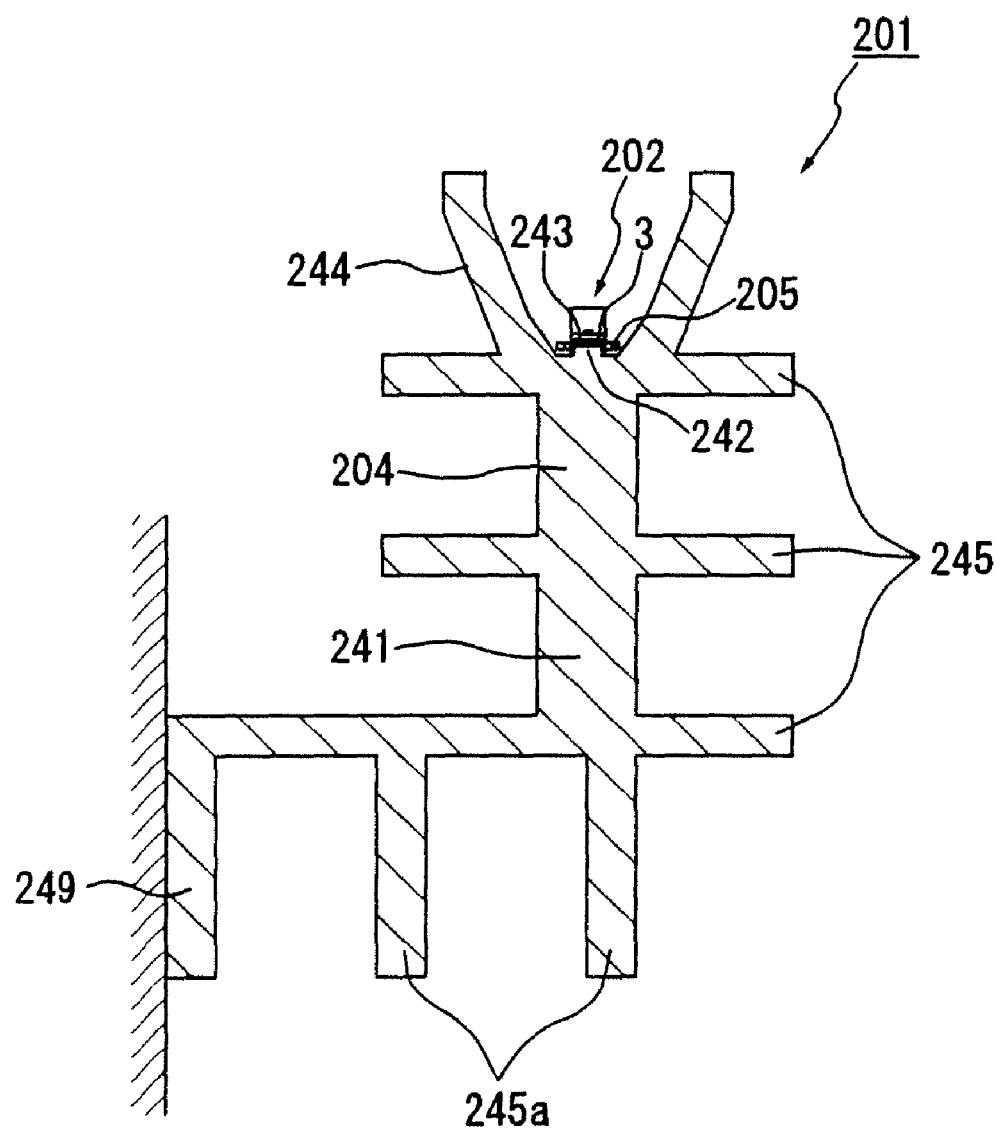
FIG. 12E is a front cross sectional view showing another modification of the third embodiment.

The light emitting device 201 in FIG. 12B is explained earlier such that the bottom of the plate member 249 may be contacted with the other member. Alternatively, as shown in FIG. 12E, a part of the fins 245 may protrude outside from the other fins 245 in the width direction such that its end is provided with a plate member 249 extending vertically and the plate member 249 is connected to the other member. As shown in FIG. 12E, the light emitting device 201 has plural fins 245a extending downward from the bottom of the device, other than the plate member 249. By the light emitting device 201, heat can be also dissipated to the air from the bottom side of the device using the fins 245a.

Figure 12F:
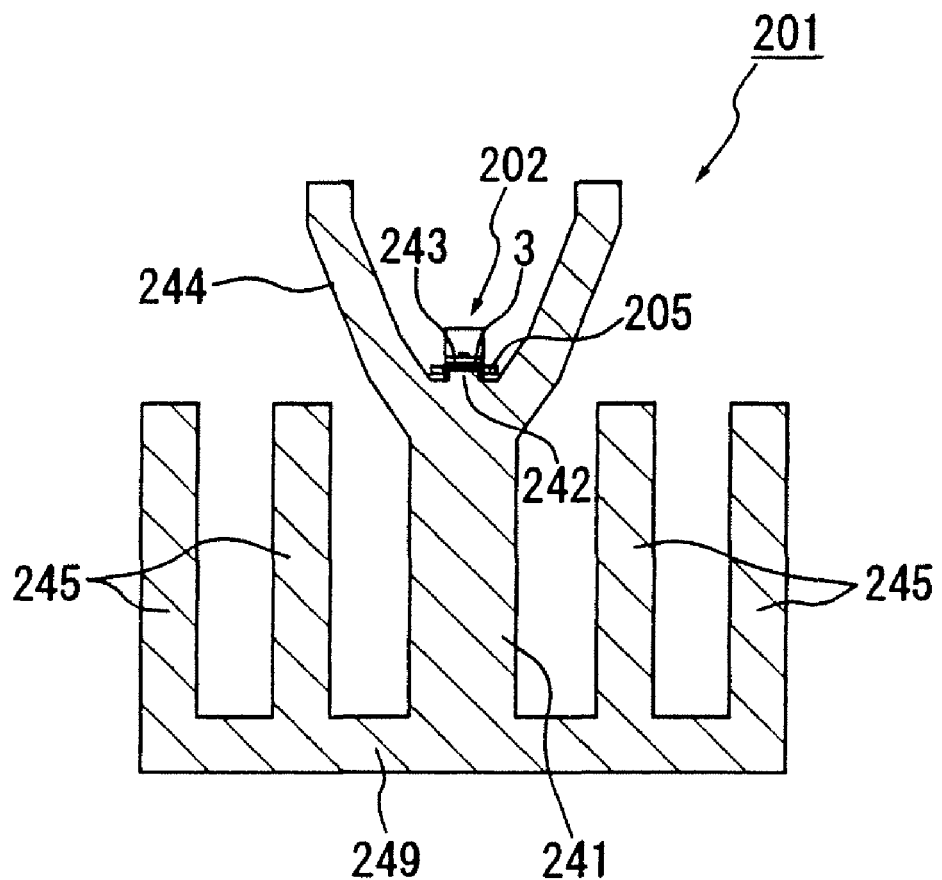
FIG. 12F is a front cross sectional view showing another modification of the third embodiment.

The light emitting device 201 in FIG. 12B is constructed such that the openings formed between the adjacent fins 245 are directed to the side of the device, but they may be directed to the top of the device, e.g., as shown in FIG. 12F. The light emitting device 201 in FIG. 12F is provided with a plate member 249 extending outside in the width direction of the device from the main body 241 of the heat dissipation member 204, and the heat dissipation member 204 has the fins 245 formed at intervals in the width direction.

Figure 12G:
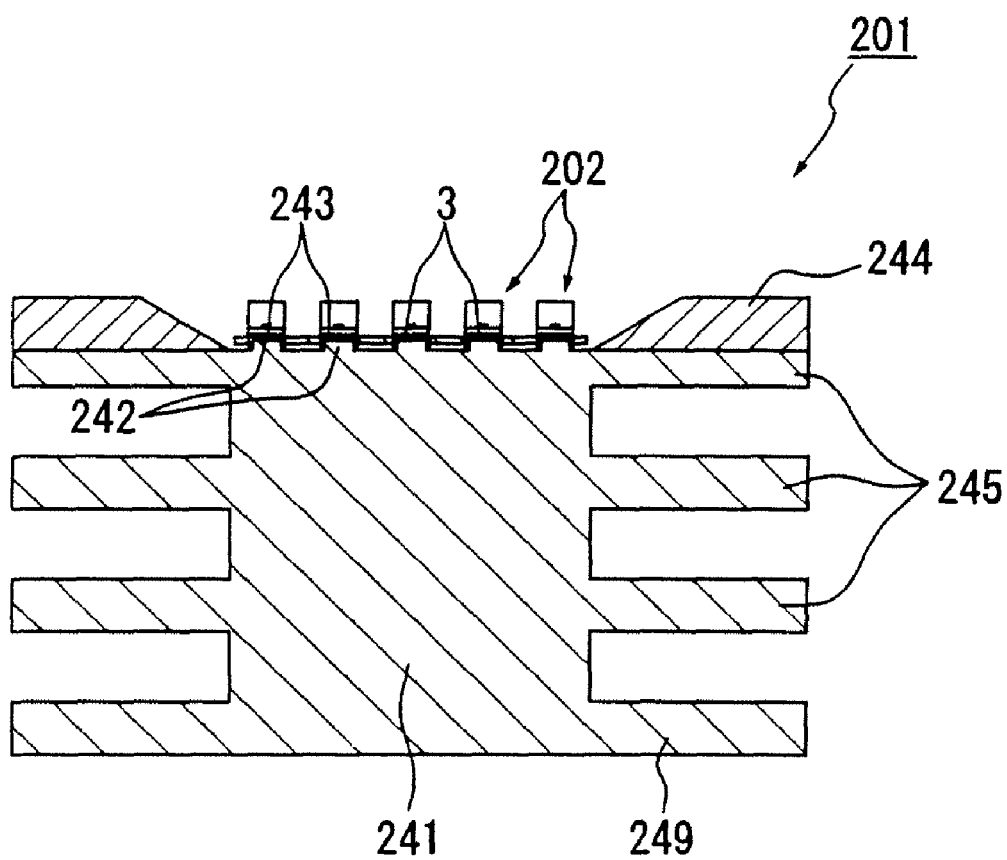
FIG. 12G is a front cross sectional view showing another modification of the third embodiment.

The light emitting device 201 in FIG. 12B is constructed such that the reflecting mirror 244 is integrated with the main body 241, but it may be formed of a material different from the heat dissipation member 204 to provide an external reflecting mirror 244. The light emitting device 201 in FIG. 12G is constructed such that the plural light-emitting portions 202 are arranged in the width direction, and the bonding portion 243 and the main body 241 are relatively wide in the width direction.

Figure 12H:
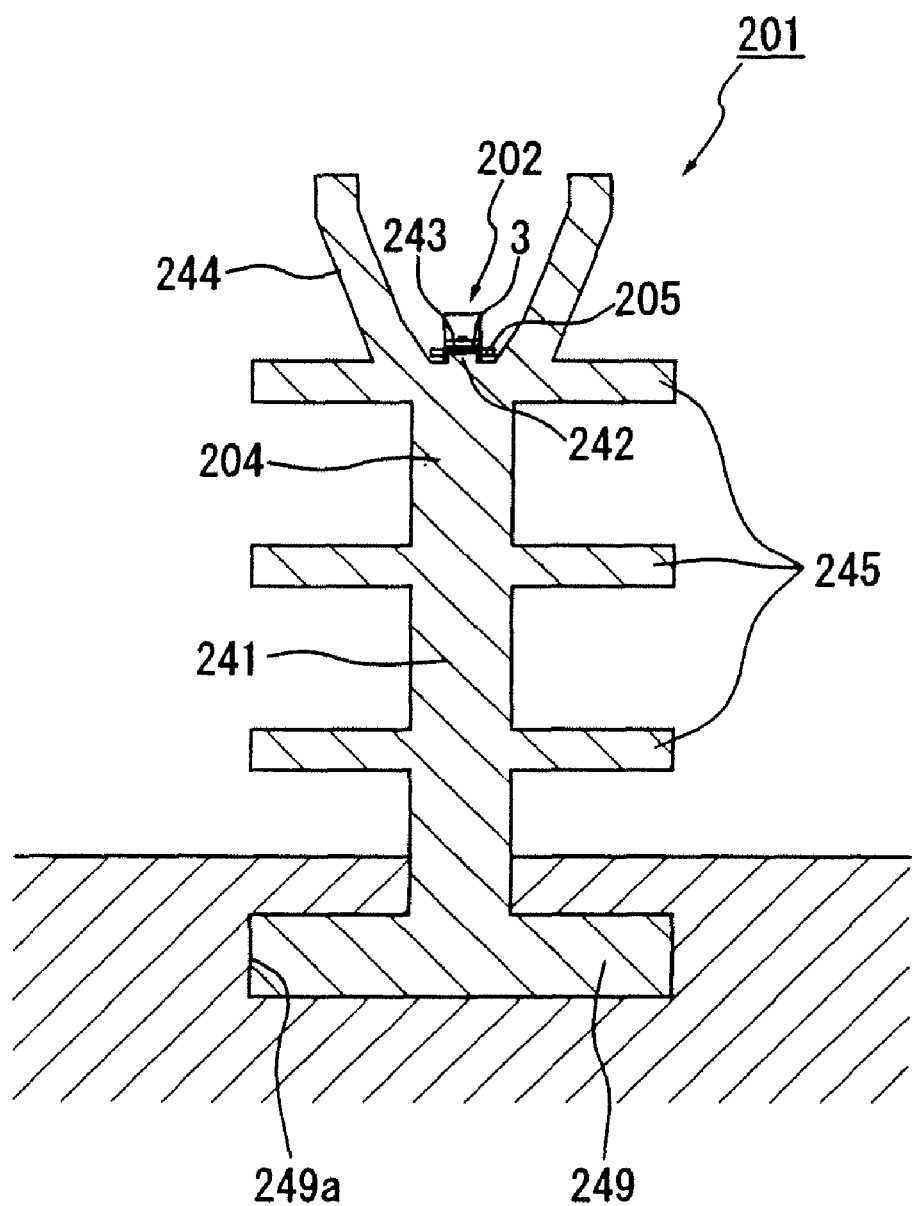
FIG. 12H is a front cross sectional view showing another modification of the third embodiment.

The light emitting device 201 in FIG. 12B is constructed such that the bottom surface of the plate member 249 is contacted with the other member, but the plate member 249 may be embedded in the other member, e.g., as shown in FIG. 12H. The light emitting device 201 in FIG. 12H is constructed such that the other member is provided with, e.g., a receiving part 249a in which the plate member 249 is received and which extends in the longitudinal direction, and the plate member 249 is inserted into the other member to fix the light emitting device 201 to the other member. Thereby, the components of the device can be stabilized more than fixing by using a fastening member such as a screw and a rivet. This is advantageous especially when the frequency of switch on and off is high and the stress change in each member caused by thermal stress is big.

Figure 12I:
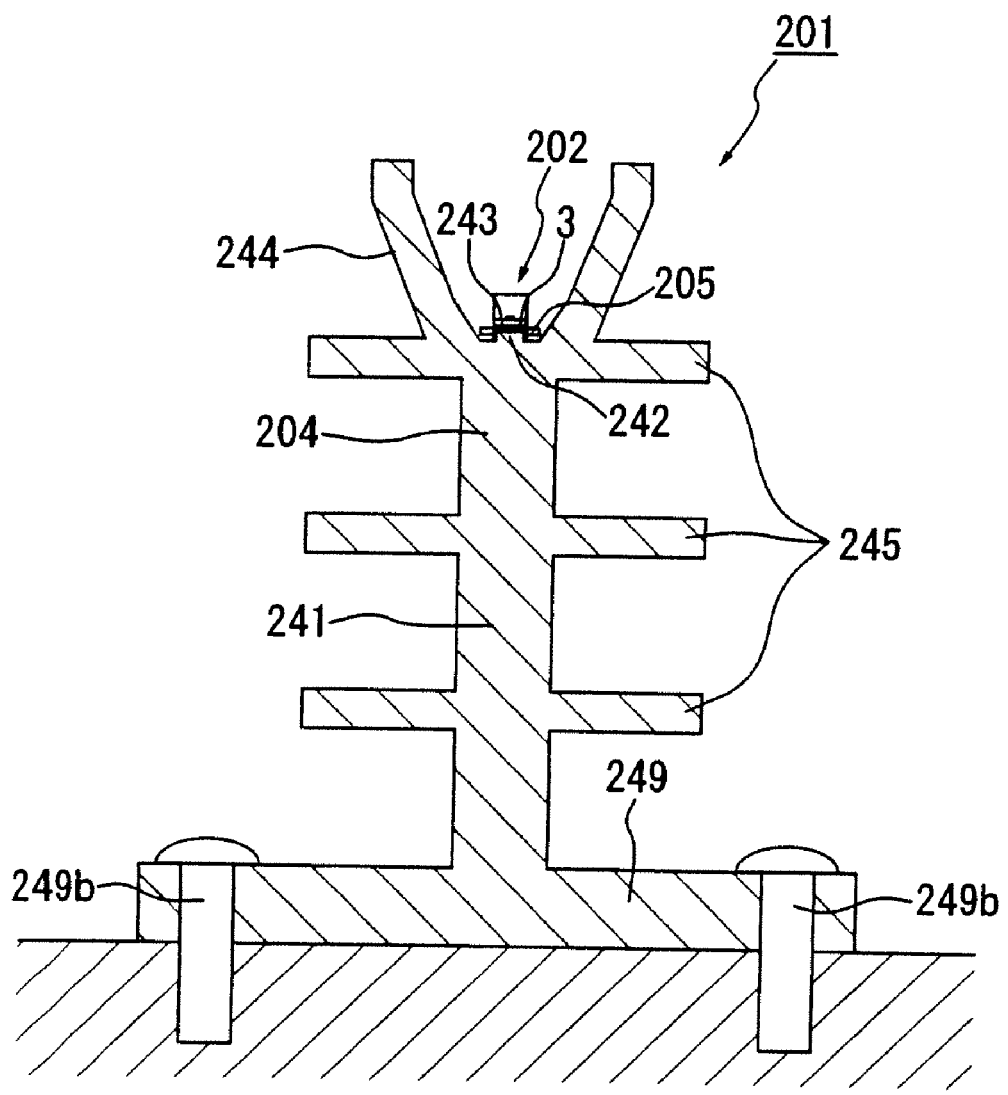
FIG. 12I is a front cross sectional view showing another modification of the third embodiment.
Figure 12J:
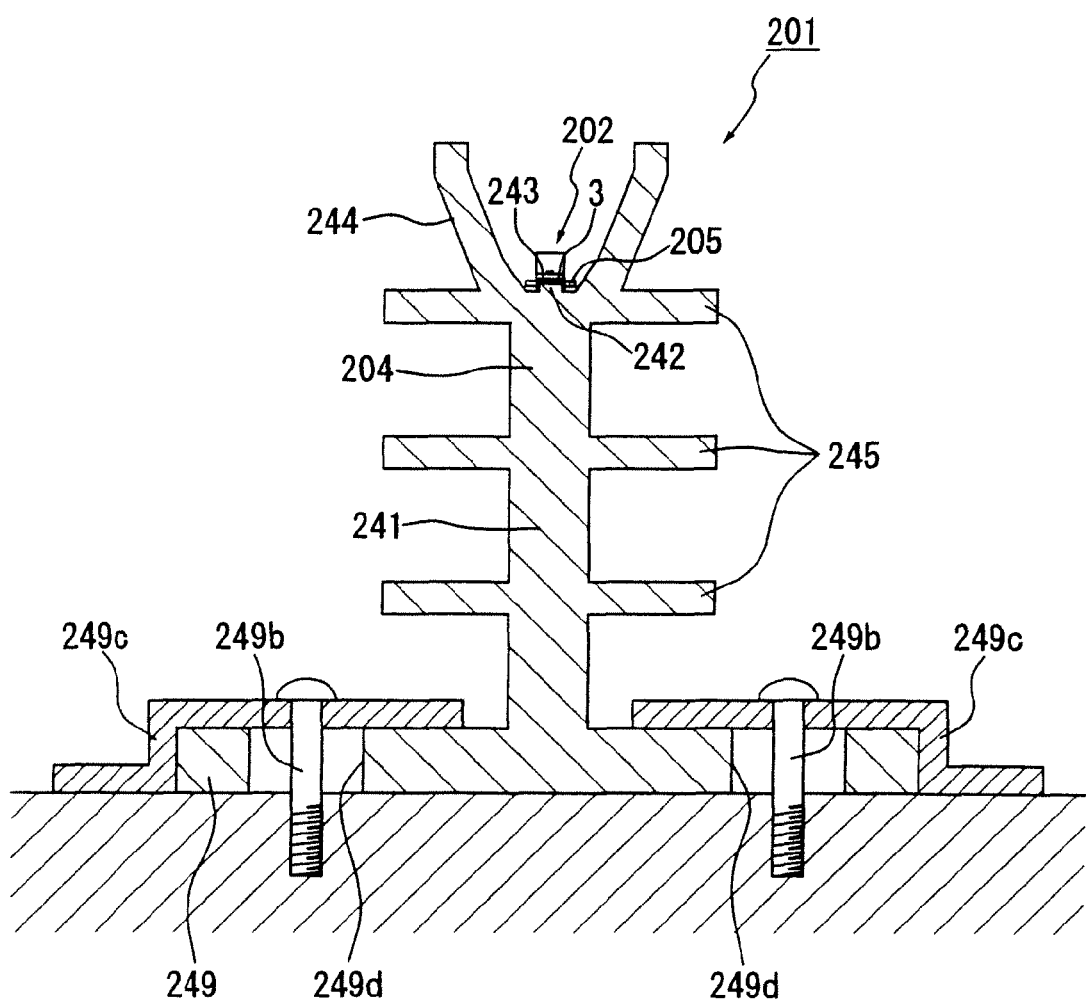
FIG. 12J is a front cross sectional view showing another modification of the third embodiment.

Alternatively, as shown in FIGS. 12I and 12J, the plate member 249 may be fixed to the other member by using a fastening member 249b such a screw and a rivet. FIG. 12I shows an example that the plate member 249 is fixed to the other member by using rivets. FIG. 12J shows an example that the plate member 249 is provided with insertion holes 249d, and a holding member 249c contacting the top surface of the plate member 249 and the other member is screw-bonded to the other member. The light emitting device 201 in FIG. 12J is constructed such that the plate member 249 is sandwiched by the holding member 249c and the other member, whereby heat can be dissipated through the plate member 249 to the holding member 249c.

Figure 12K:
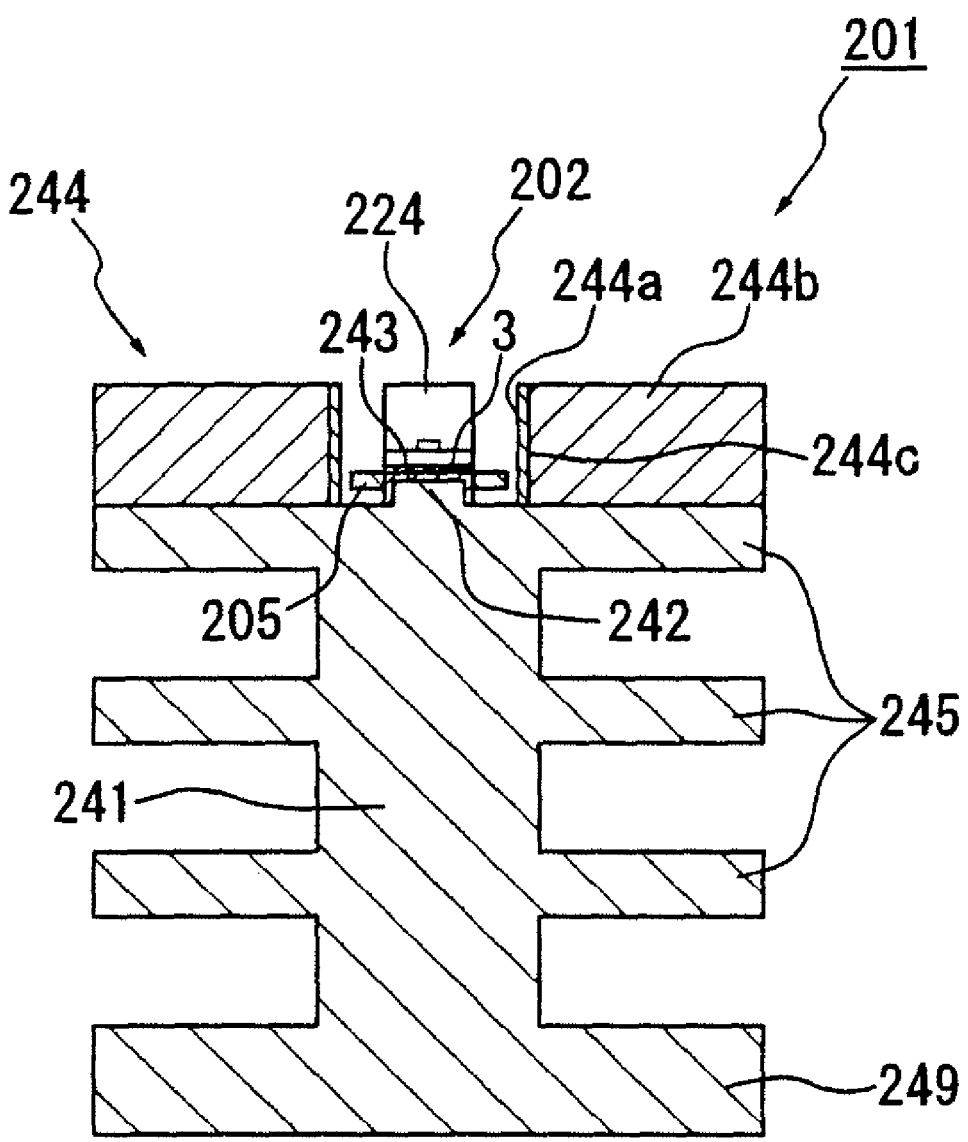
FIG. 12K is a front cross sectional view showing another modification of the third embodiment.

Alternatively, as shown in FIG. 12K, the reflecting surface 244a may be formed close to and opposite the side face of the rectangular solid sealing portion 224 in the light-emitting portion 202. The light emitting device 201 in FIG. 12K is provided with an external reflecting mirror 244, which is composed of an aluminum plate 244b disposed on the top fin 245, and a white sheet 244c as the reflecting surface 244a on the inner surface of the aluminum plate 244b. Thus, even by using the rectangular solid sealing portion 224, light radiated through the side face thereof can be efficiently guided upward and the brightness directly on the light-emitting portion 202 can be enhanced thereby.

Figure 12L:
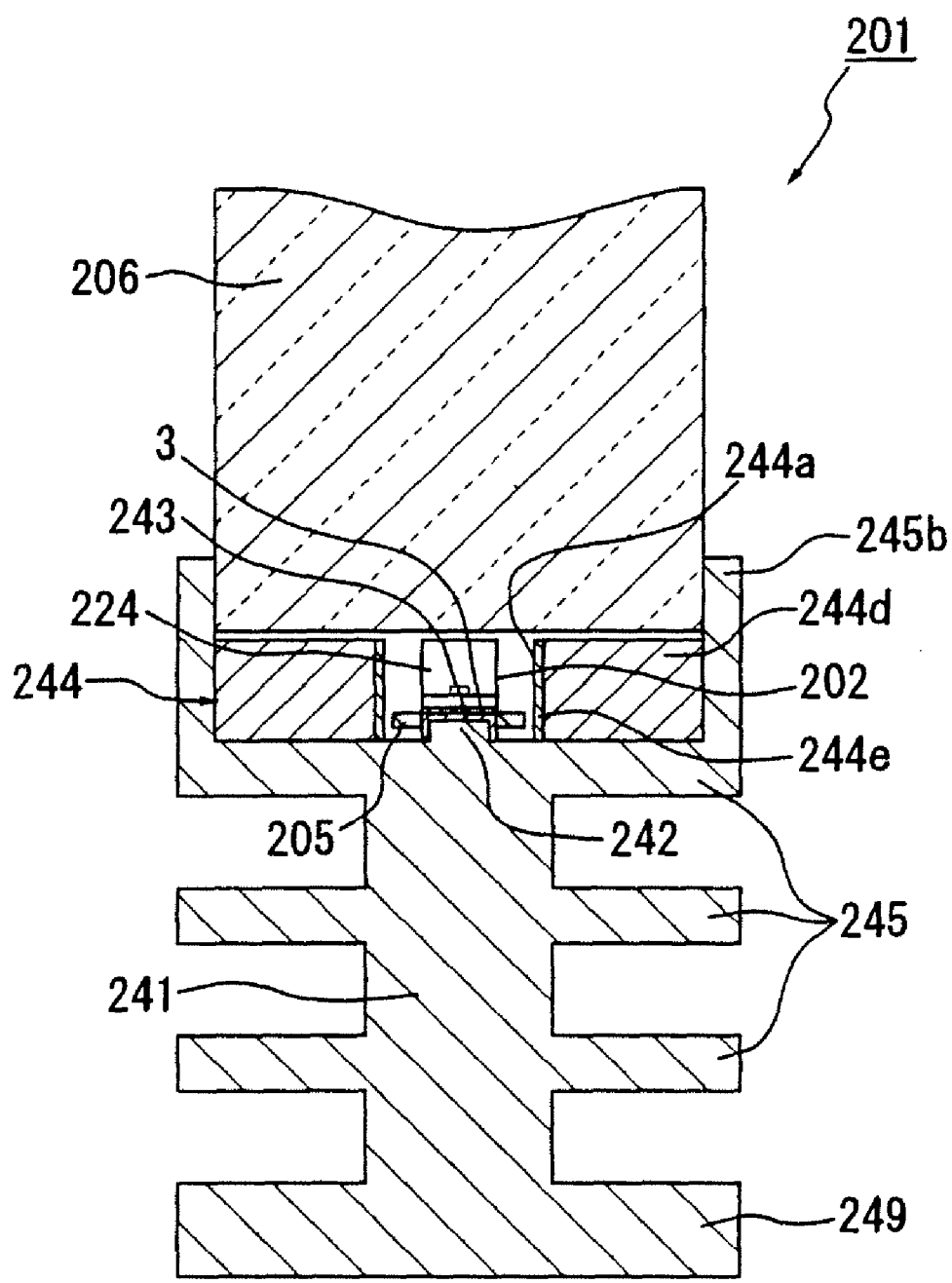
FIG. 12L is a front cross sectional view showing another modification of the third embodiment.

Alternatively, as shown in FIG. 12L, extension parts 245b may be formed extending upward from the tip of the two top fins 245 in the width direction such that a light guiding plate 206 is inserted between the extension parts 245b. The light emitting device 201 in FIG. 12L is provided with a reflecting mirror 244, which is composed of a metal plate 244d disposed on the top fin 245, and a white coating 244e on a surface of the metal plate 244d opposite the sealing portion 224. The surface of the white coating 244e forms a reflecting surface 244a close to and opposite the side face of the sealing portion 224. Thus, light radiated through the side face thereof can be efficiently guided upward and the brightness directly on the light-emitting portion 202 can be enhanced thereby.

Figure 12M:
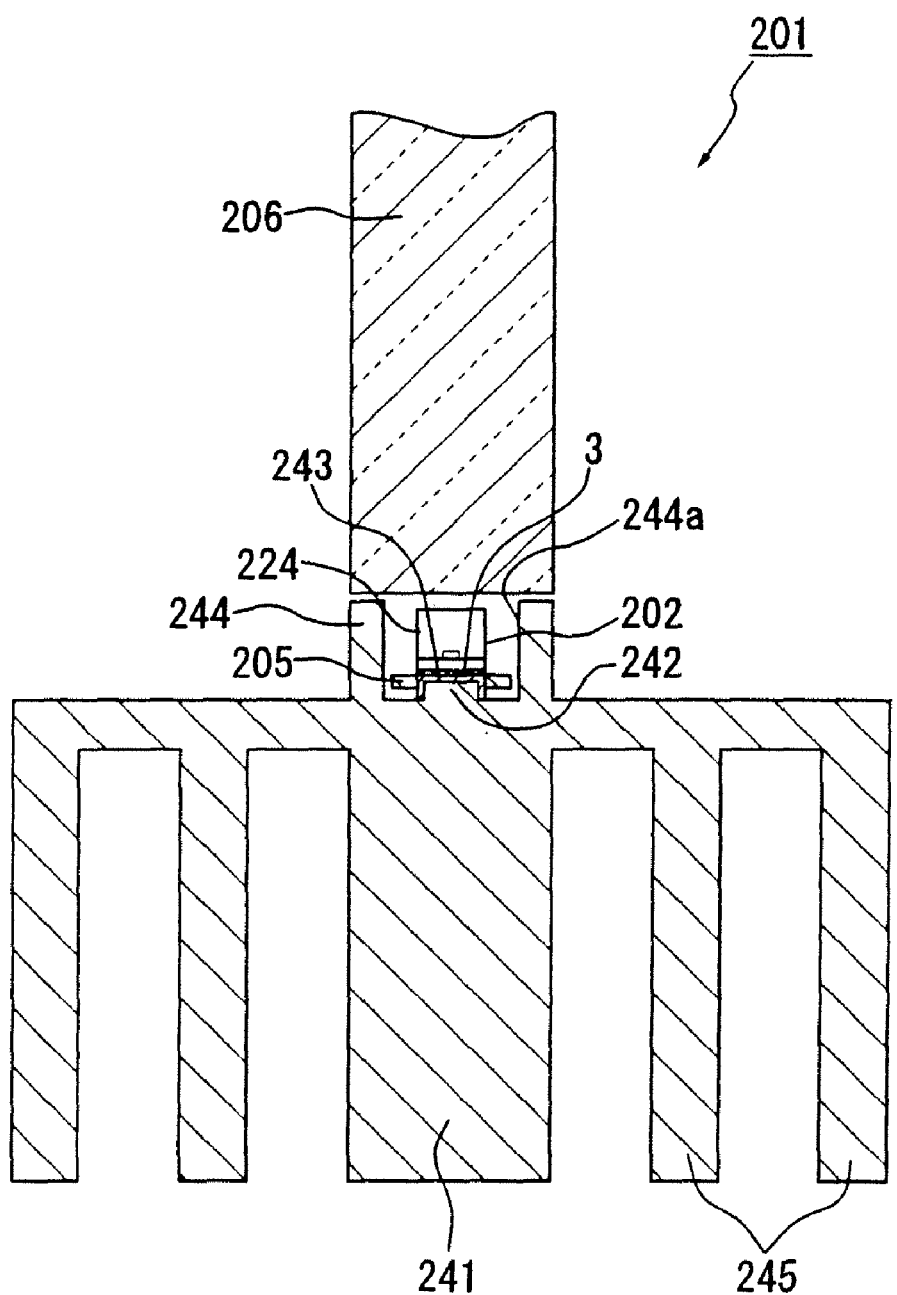
FIG. 12M is a front cross sectional view showing another modification of the third embodiment.

Alternatively, as shown in FIG. 12M, a reflecting surface 244a which is close to and opposite the side face of the sealing portion 224 may be formed on a reflecting mirror 244 integrated with the heat dissipation member 204. The light emitting device 201 in FIG. 12M is provided with a light guiding plate 206 directly on the light-emitting portion 202, and the reflecting mirror 244 has the same thickness as the light guiding plate 206. The light emitting device 201 is provided with fins 245 extending downward.

Figure 12N:
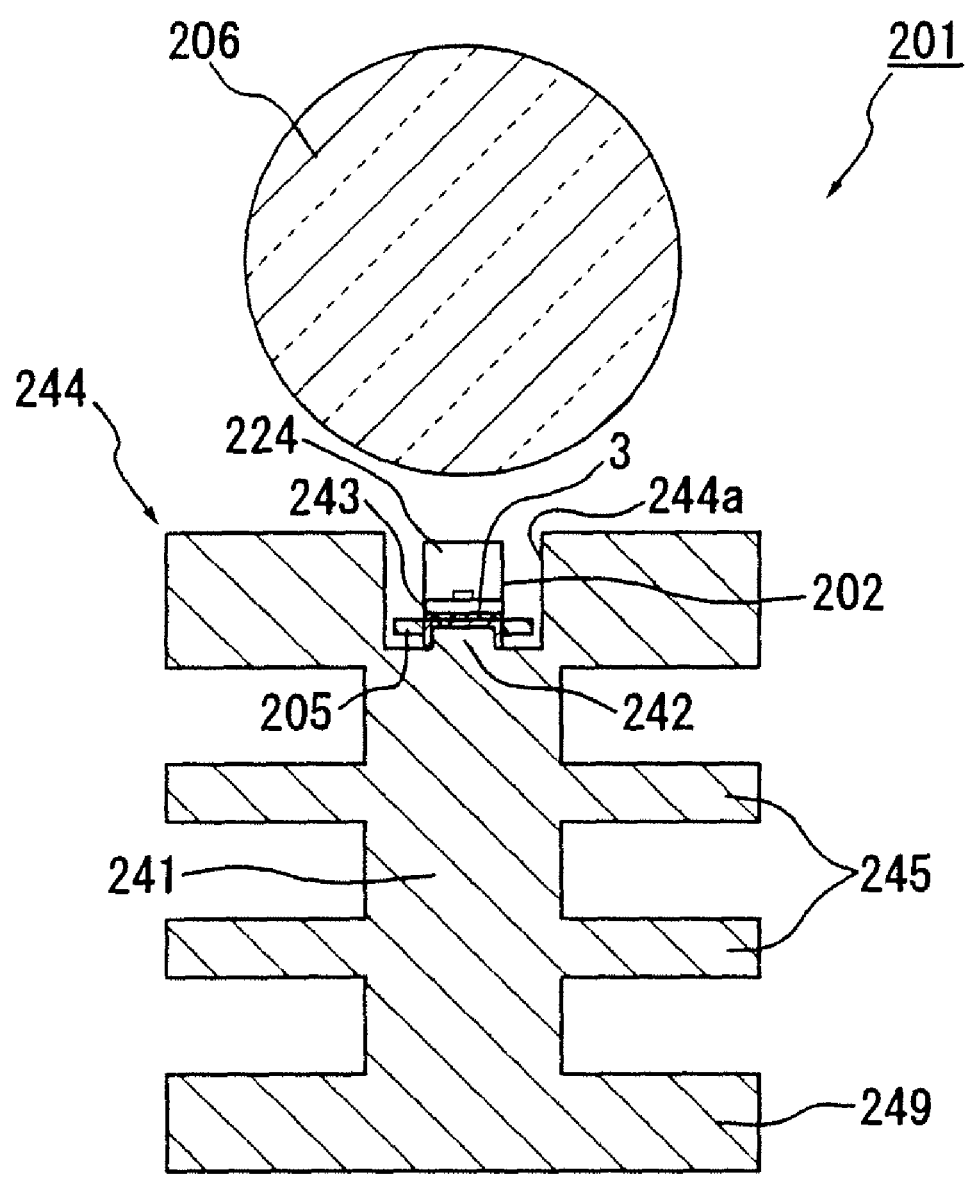
FIG. 12N is a front cross sectional view showing another modification of the third embodiment.

Alternatively, as shown in FIG. 12N, a cylindrical rod lens 206 may be formed above the light-emitting portion 202. The light emitting device 201 in FIG. 12N is provided with a reflecting mirror 244 integrated with the heat dissipation member 204 on which a reflecting surface 244a which is close to and opposite the side face of the sealing portion 224. The light emitting device 201 in FIG. 12N is constructed such that the reflecting mirror 244 has the same length as the fins 245 extending toward the outside in the width direction. The light-emitting portion 202 is enclosed in a concave portion formed in the reflecting mirror 244.

Figure 13:
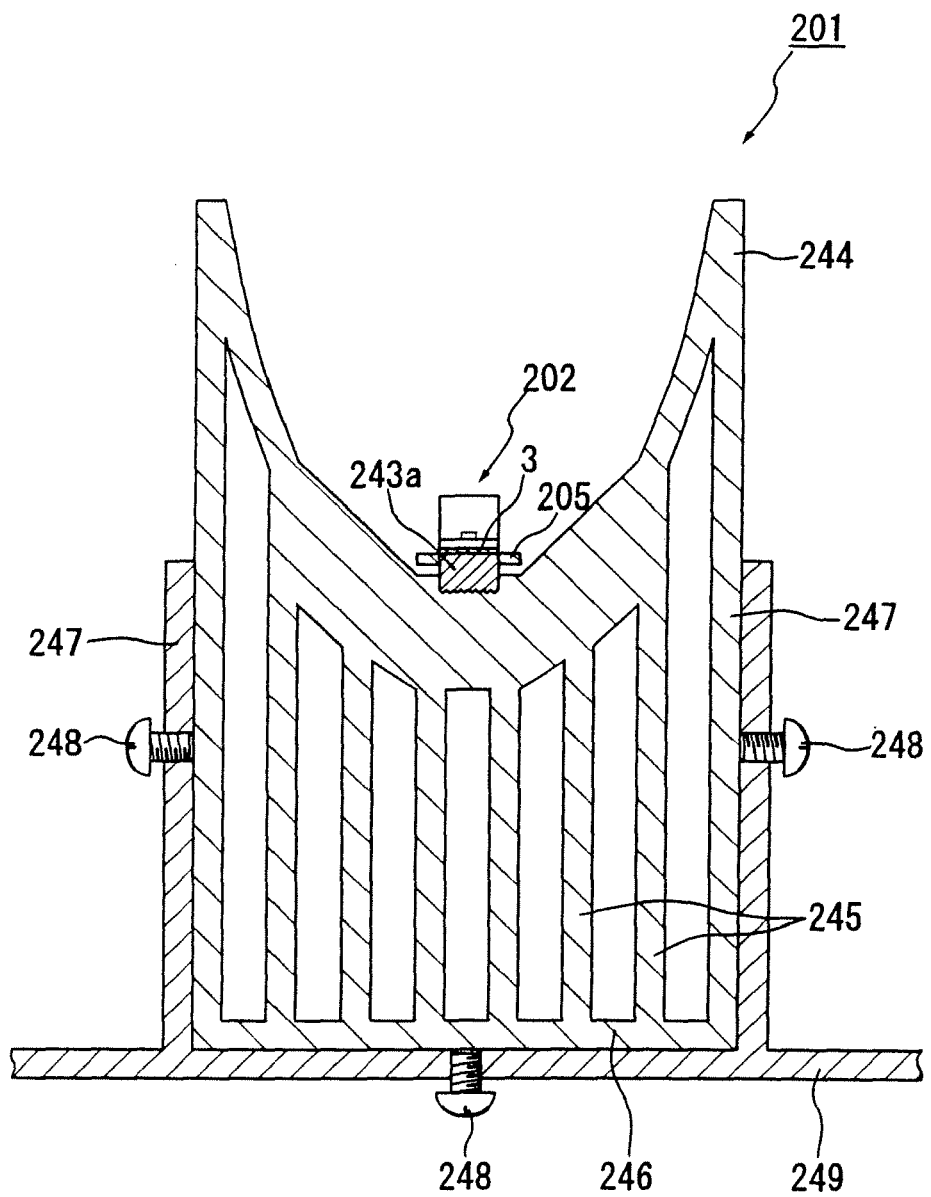
FIG. 13 is a front cross sectional view showing another modification of the third embodiment.

The light emitting device 201 in FIGS. 11A and 11B is constructed such that a gap between the fins 245 of the heat dissipation member 204 is opened at the lower end, but the lower ends of the fins 245 may be connected together by a plate portion 246. The light emitting device 201 in FIG. 13 is provided with an outer frame 247 extending downward from both ends of the reflecting mirror 244 in the width direction, and the outer frame 247 is connected to the plate portion 246. An outer heat dissipation member 249 is surface-contacted with the outer frame 247 and the plate portion 246 by screws 248. The outer heat dissipation member 249 can suitably use a frame part of a house, a vehicle etc. on which the device is to be installed. For example, when installed in a house, it may be a steel frame thereof, and when installed in a vehicle, it may be a body thereof.

Figure 14:
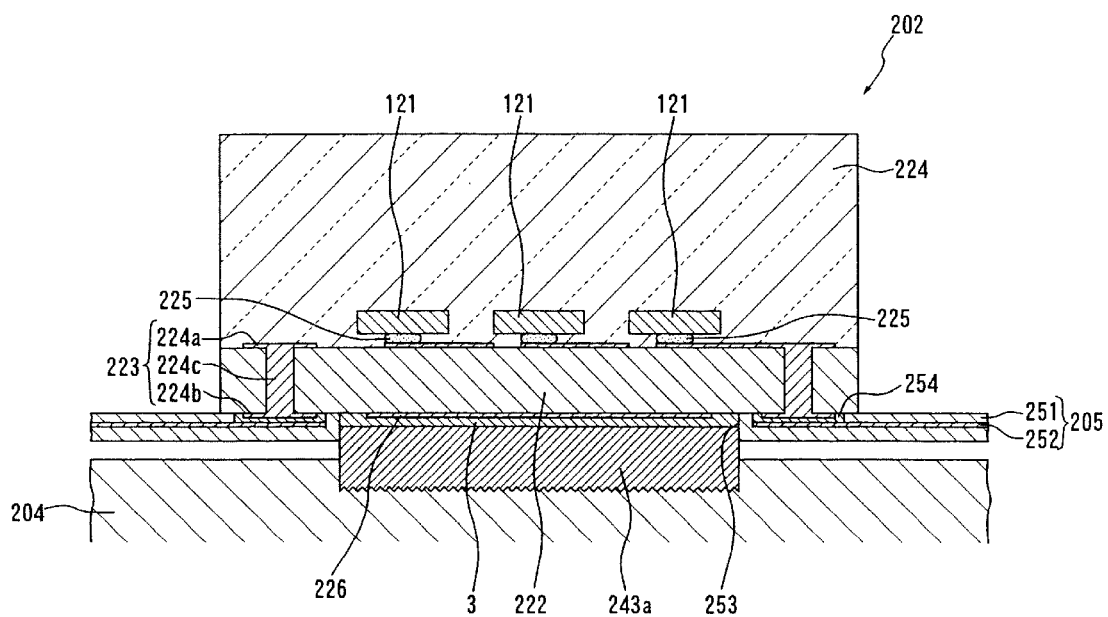
FIG. 14 is an enlarged cross sectional view showing a light-emitting portion and its vicinity.

In the third embodiment the bonding portion 243 of Zn plating is formed on the top surface of the heat dissipation member 204, but as shown in FIG. 13, a bonding portion 243a may be formed by disposing a copper piece on the top surface of the heat dissipation member 204. FIG. 14 is an enlarged cross sectional view showing the light-emitting portion and its vicinity. As shown in FIG. 14, the bonding portion 243a is constructed such that its lower part is embedded in the heat dissipation member 204 and its upper part protrudes upward form the heat dissipation member 204. In this embodiment, the amount of protrusion of the bonding portion 243a is 250 µm, and due to such a large amount of protrusion the bonding portion 243a can progressively function as a buffer for the light-emitting portions 202 and the heat dissipation member 204. The lower part of the bonding portion 243a is bonded to the heat dissipation member 204 by ultrasonic bonding.

Figure 15:
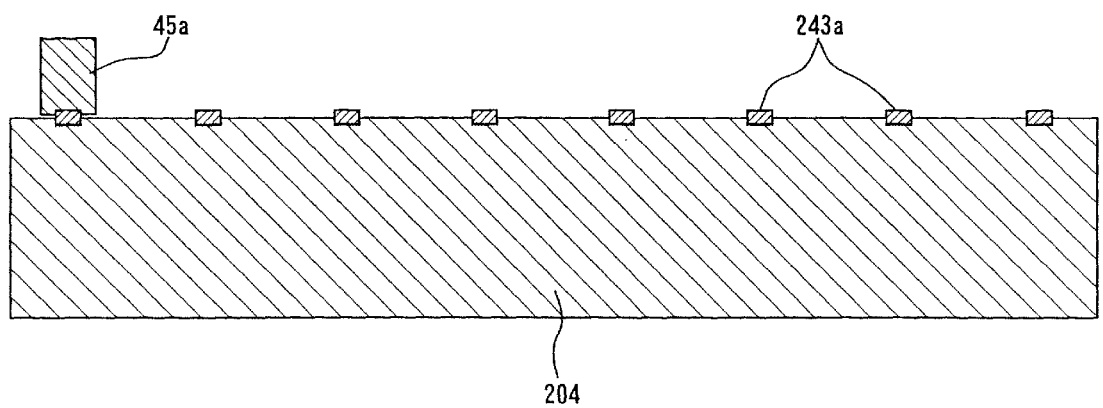
FIG. 15 is a cross sectional view illustrating a method of making a bonding portion in FIG. 14.
Figure 16:
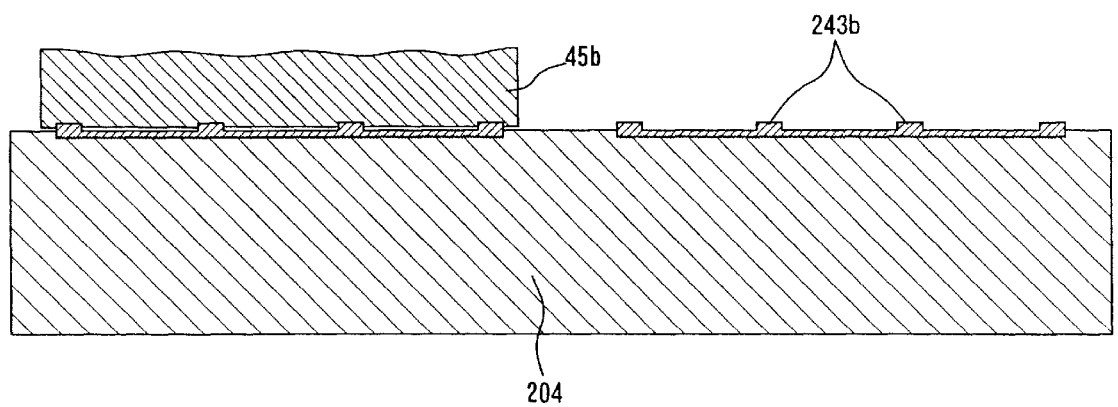
FIG. 16 is a cross sectional view illustrating the method of making the bonding portion.

FIGS. 15 and 16 illustrate a method of making the bonding portion in FIG. 14.

As shown in FIG. 15, the bonding portion 243a as the copper piece is disposed on the top surface of the heat dissipation member 204, and the bonding portion 243a is bonded thereto by ultrasonic bonding while applying a load by using a tool 45a. Although FIG. 15 shows an example that the bonding portion 243a is each separately bonded to the heat dissipation member 204, the plural bonding portions 243a may be integrally formed and bonded together to the heat dissipation member 204 as shown in FIG. 16. As shown in FIG. 16, of the right bonding portion 243a, the four bonding portion 243a are integrally formed and bonded while applying a load and ultrasonic by using a tool 45b contacting the four bonding portion 243a.

Figure 17:
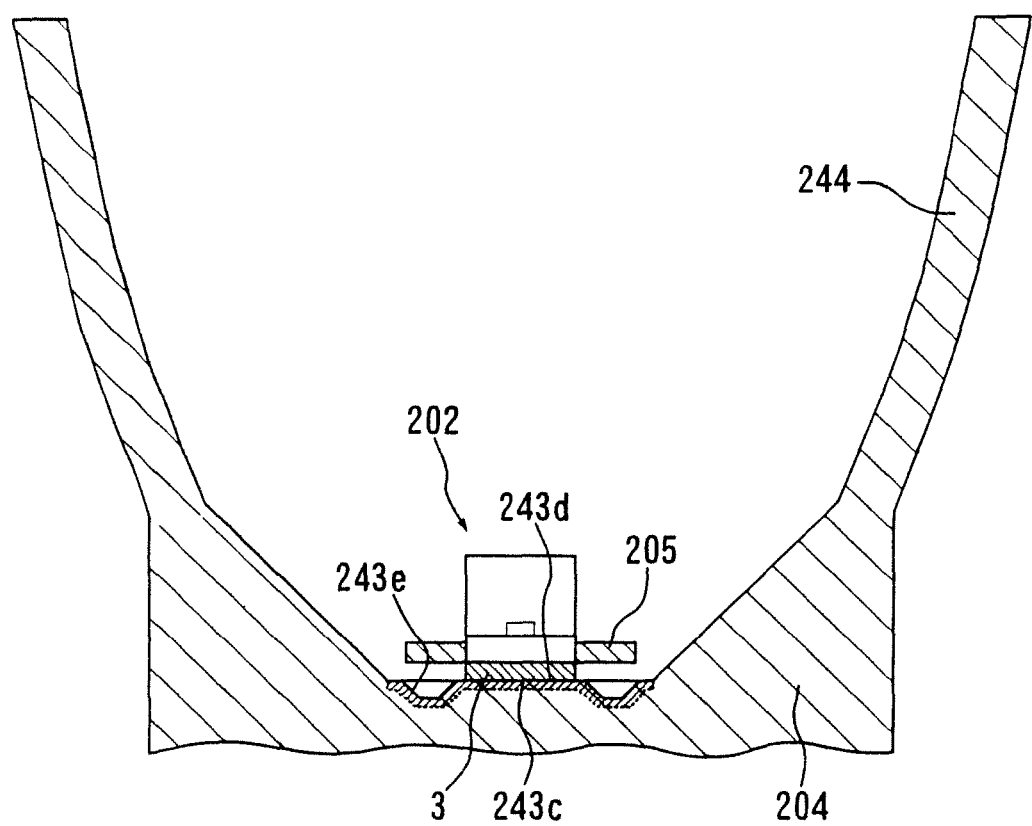
FIG. 17 is a front cross sectional view showing another modification of the third embodiment.
Figure 18:
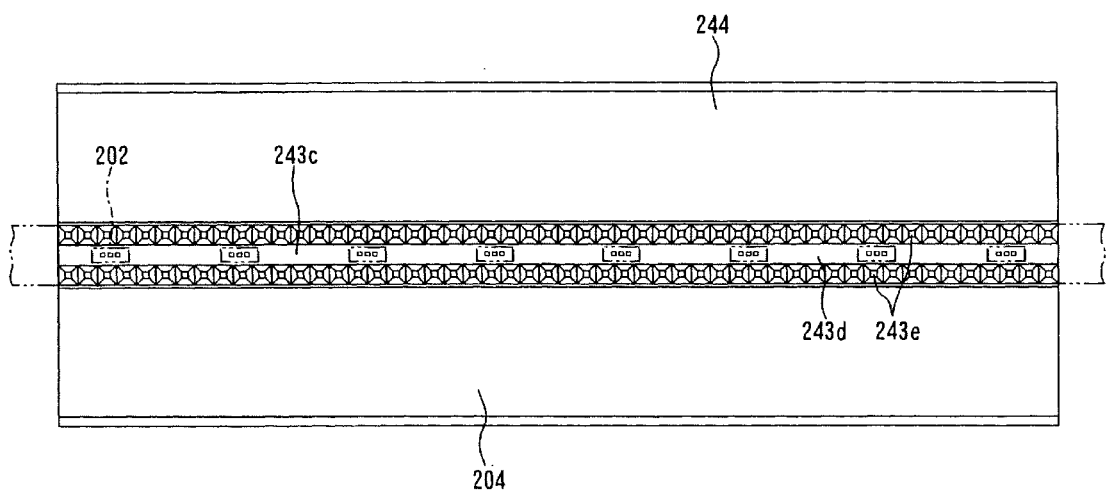
FIG. 18 is a top view showing the modification in FIG. 17.

Alternatively, as shown in FIGS. 17 and 18, a bonding portion 243c may be formed as a blend of copper and aluminum. FIG. 17 is a front cross sectional view showing a light emitting device in another modification of the third embodiment. FIG. 18 is a top view showing the light emitting device in FIG. 17. The bonding portion 243c in FIG. 17 is constructed such that a flat portion 243d is formed at a site on which the light-emitting portion 202 is mounted and concave-convex portions are formed on both sides of the flat portion 243d in the width direction. As shown in FIG. 18, the flat portion 243d has around the same width as the light-emitting portion 202 and formed in the longitudinal direction, and the concavo-convex portions 243d are formed along the longitudinal direction and on both sides of the flat portion 243d.

Figure 19:
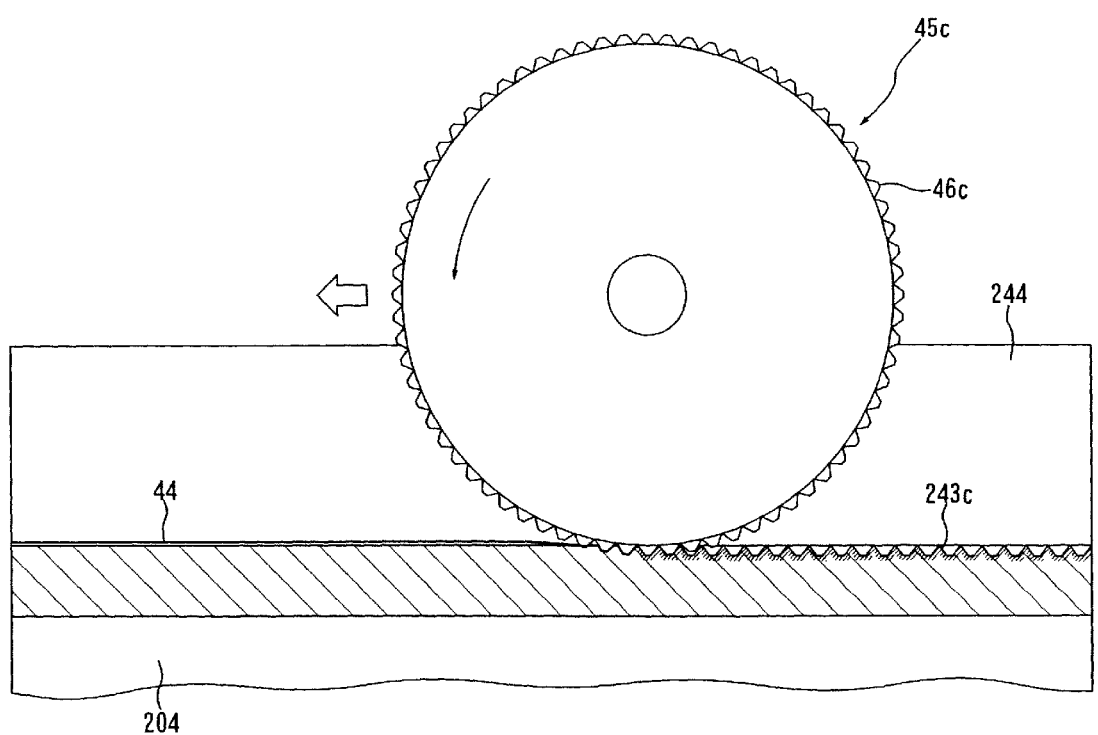
FIG. 19 is a side view illustrating a method of making a bonding portion in FIG. 17.
Figure 20:
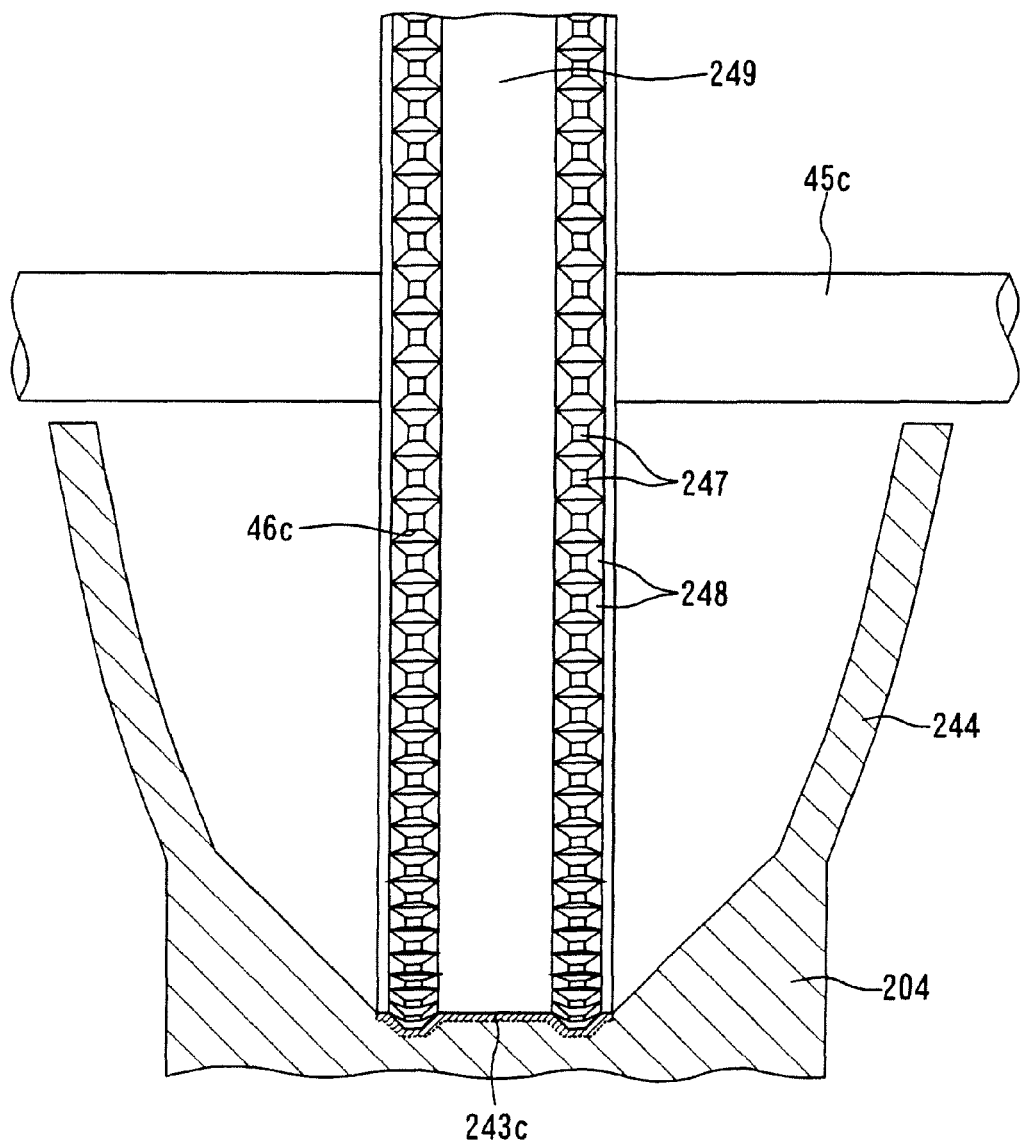
FIG. 20 is a front view illustrating the method of making the bonding portion.

As shown in FIG. 19, the bonding portion 243c is formed such that a copper foil 44 is disposed on the top surface of the heat dissipation member 204, the copper foil 44 is pressed against the heat dissipation member 204 by suing a tool 45c while applying ultrasonic wave to the bonding site. As shown in FIG. 19, the roller-shaped tool 45c with a contact face 46c formed on the outer periphery is rolled on the copper foil 44 to form the bonding portion 243c with the same shape over in the longitudinal direction. As shown in FIG. 20, the contact face 46c of the tool 45c is composed of a flat surface 249 corresponding to the flat portion 243d, plural protrusions 247 protruding outward in the radial direction, and slopes 248 formed around the protrusions 247 and inclined upward. The protrusions 247 are each formed into a flat square on its top surface and arranged at intervals on the circumference of the tool 45c. The slopes 248 are each formed connecting to the corresponding protrusion 247, and declined from the outer edge of the protrusion 247 toward the inside in the radial direction. The contact face 46c of the tool 45c is most concave at the intersection of the slopes 248 between the adjacent protrusions 247.

Fourth Embodiment

Figure 21:
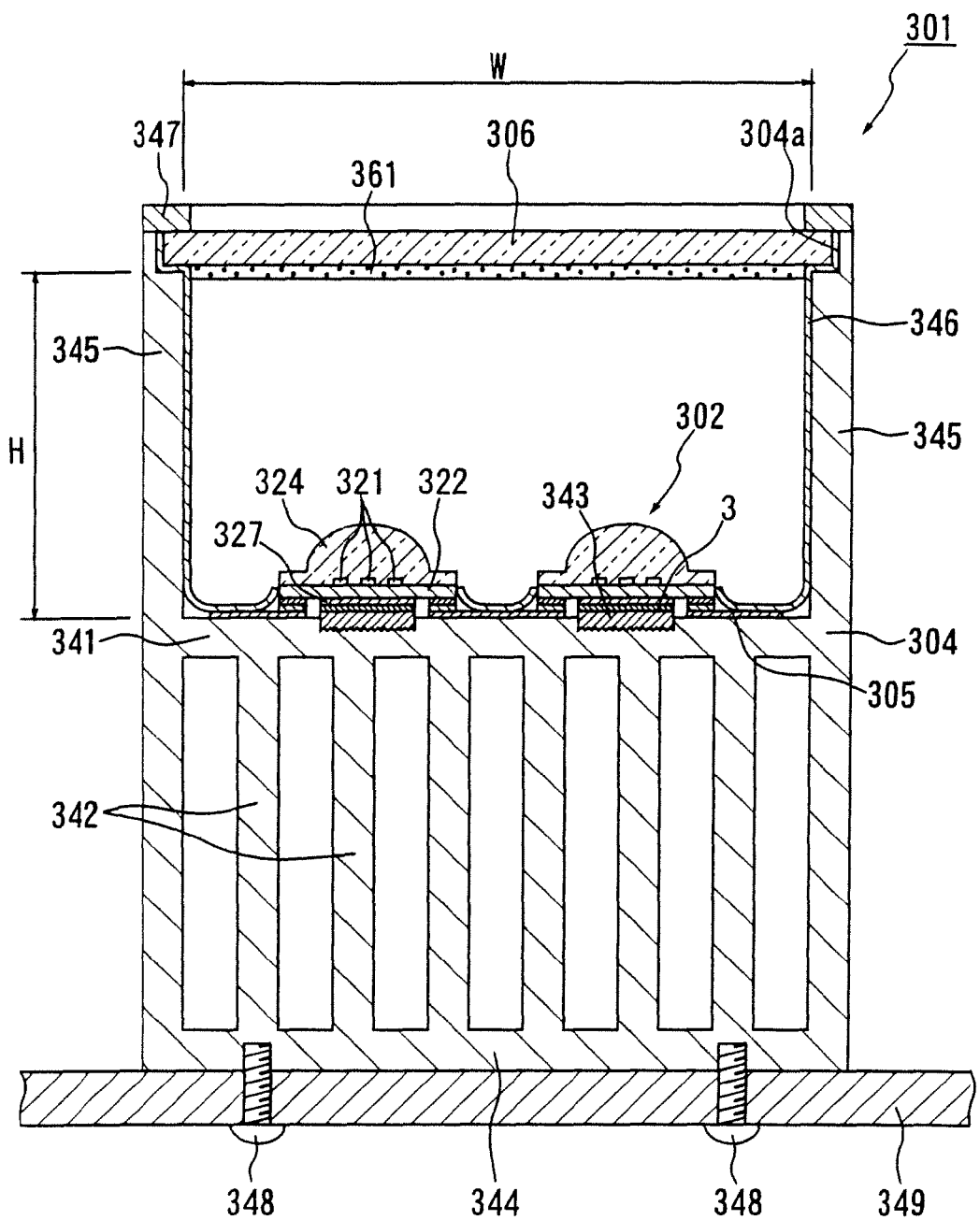
FIG. 21 is a cross sectional view showing a light emitting device in a fourth preferred embodiment according to the invention.
Figure 22:
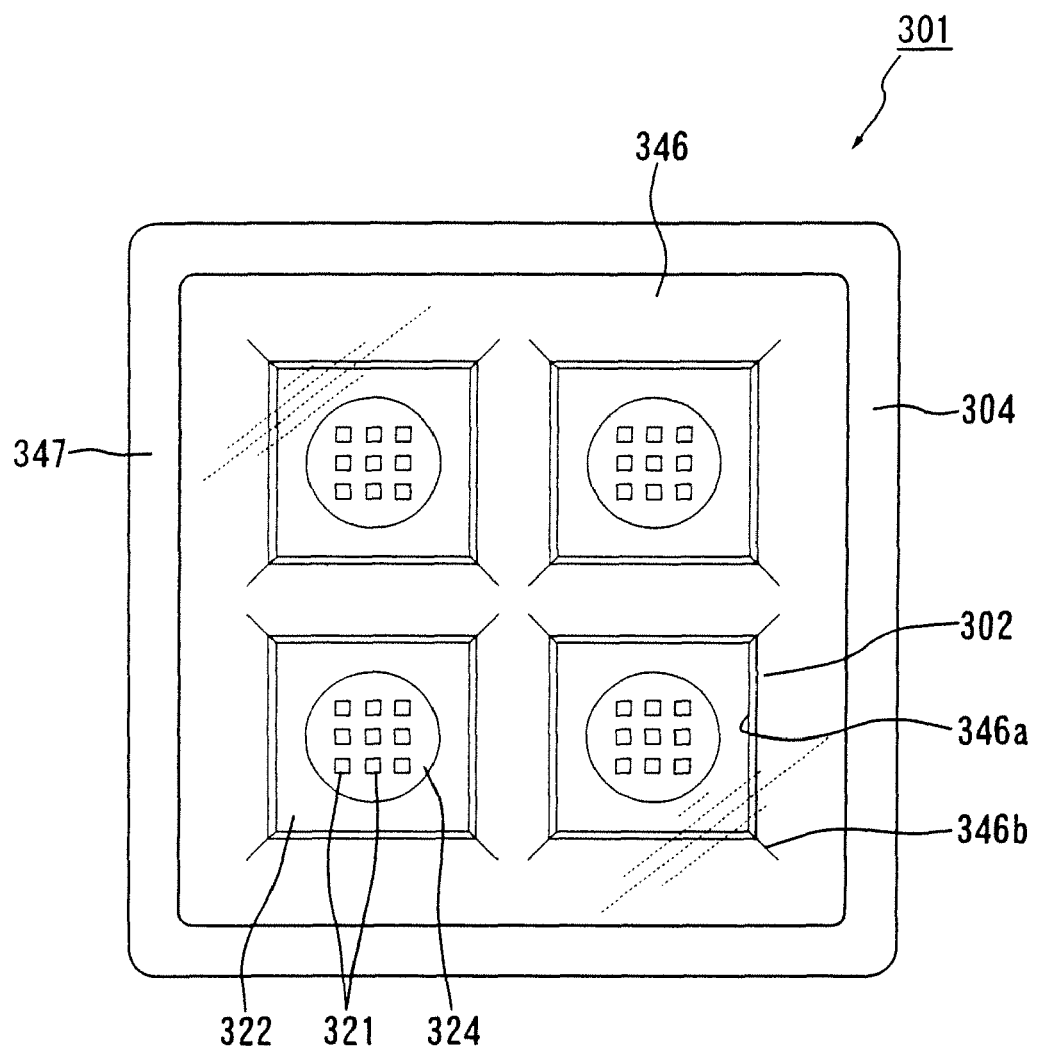
FIG. 22 is a top view showing the light emitting device in FIG. 21.

FIGS. 21 and 22 illustrate a light emitting device in the fourth embodiment of the invention. FIG. 21 is a cross sectional view showing the light emitting device, and FIG. 2 is a top view showing the light emitting device.

As shown in FIG. 21, the light emitting device 301 is composed of plural light-emitting portions 302 each including plural LED elements 321, a heat dissipation member 304 connected via a solder material 3 to the light-emitting portions 202, a wiring portion 305 for feeding power to the light-emitting portions 302. In this embodiment, the heat dissipation member 304 includes a housing that houses the light-emitting portions 302 and has an opening 304a on the top. The light emitting device 301 is provided with a plate-like glass member 306 for closing the opening 304a.

The light-emitting portions 302 are each composed of the plural LED elements 321 for emitting ultraviolet light, a mount portion 322 for mounting the LED elements 321, and a sealing portion 324 for sealing the LED elements 321 on the mount portion 322. The LED elements are each of flip-chip type, and each composed of a GaN substrate and a semiconductor layer epitaxially grown on the substrate. For example, the LED element 321 has an emission wavelength of 380 to 390 nm. As shown in FIG. 22, in this embodiment, the nine LED elements 321 in total, three by three in the horizontal and vertical directions, are mounted on one mount portion 322. The mount portion 322 is formed of a ceramic substrate of $Al_2O_3$, and has on its entire bottom surface a metal layer 327 of copper able to be bonded to the solder material 3. The sealing portion 324 is formed of ZnO-based glass with a refractive index of 1.8 and shaped like a light-focusing lens at the upper side.

As shown in FIG. 21, the heat dissipation member 304 is formed of aluminum, and composed of a main body 341 on which the light-emitting portions 302 are bonded via the solder material 3, plural fins 342 protruding downward from the main body 341, a bonding portion 343 formed on the top surface of the main body 341, a plate member 344 connecting the lower end of the fins 342, and wall portions 345 extending upward from the outer edge of the main body 341. The plate member 344 is combined with the outer heat dissipation member 349 by screws 348, and surface-contacted with the outer heat dissipation member 349. The bonding portion 343 is provided for each of the light-emitting portions 302 and, as mentioned earlier, formed by embedding the lower part of the copper piece in the main body 341. The heat dissipation member 304 is formed nearly a square in the top view (See FIG. 22). In this embodiment, the main body 341, the fins 432, the plate member 344 and the wall portions 345 are formed by the die casting of aluminum.

Figure 23:
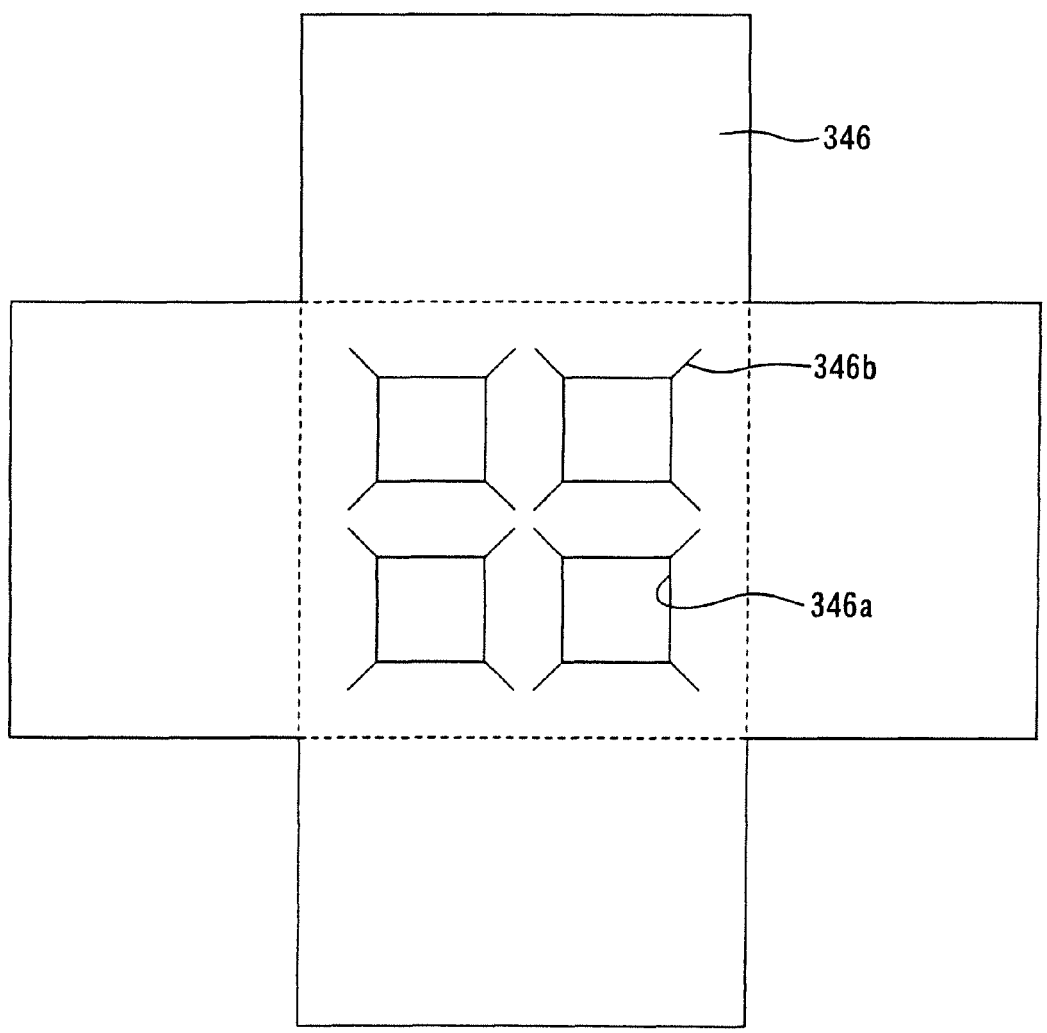
FIG. 23 is a development view showing a reflecting sheet in FIG. 21.

The top surface of the main body 341 of the heat dissipation member 304 and the inside surface of the wall portion 345 thereof are covered with a reflecting sheet 346. The reflecting sheet 346 is formed of e.g., white fluorine based resin preferably exemplified as a stretched polytetrafluoroethylene. FIG. 23 is a development view showing the reflecting sheet in FIG. 21. As shown in FIG. 23, the reflecting sheet 346 is composed of rectangular holes 346a through which the light-emitting portions 302 can be passed, and cuts (or slits) 346b extending from the corners of the holes 346a. The holes 346a are each formed smaller than the light-emitting portion 302, and the flexible reflecting sheet 346 is, as shown in FIG. 21, bent such that the holes 346a are close to the light-emitting portions 302 and the inside of the heat dissipation member 304 is tightly covered with by the reflecting sheet 346. The ratio of the height H to inside width W of the main body 341 is desirably not more than 0.5 in aspect of light efficiency, and this ratio is desirably to be decreased as long as unevenness in brightness causes no problem when viewed from the top.

The glass member 306 is disposed in the opening 304a of the heat dissipation member 304 and has a phosphor layer 361 formed on the bottom. The glass member 306 is fixed to the heat dissipation member 304 from above by a fastener 347. The phosphor layer 361 includes blue, green and red phosphors o be excited by ultraviolet light emitted from the light-emitting portions 302. The glass member 306 is formed with, e.g., Pyrex (registered trademark) and may have a dichroic mirror formed on the surface for reflecting light of 400 nm or less.

The light emitting device 301 thus constructed is provided with the bonding portion 343 processed to be bonded to the solder material 3 on the heat dissipation member 304 of aluminum unable to be bonded to the solder material 3, so that the light-emitting portions 302 can be bonded via the solder material 3 to the heat dissipation member 304. Heat generated from the LED elements 21 during the operation can be smoothly transferred through the mount portion 322 and the solder material 3 to the main body 341 of the heat dissipation member 304. In this regard, since no oxide film is formed at the bonding portion 343 of the heat dissipation member 304, the solder material 3 can be securely bonded to the main body 341 and the thermal resistance between the mount portion 322 and the main body 341 can be reduced. Thus, it is very advantageous in practical use. Even when heat is generated from the LED elements 321, the adhesion between the light-emitting portion 302 and the heat dissipation member 304 via the solder material 3 can be retained such that the light-emitting portion 302 is not separated from the heat dissipation member 304 during the operation and the thermal resistance between the light-emitting portion 302 and the heat dissipation member 304 does not increase with time. Therefore, high reliability can be secured.

Where the glass member 306 including different phosphor in the phosphor layer 361 is provided, the property of light emitted from the light emitting device 301 can be changed by exchanging the glass member 306.

In this regard, where the sealing member of the LED element includes phosphor, the combination of a UV LED element and blue, green and red phosphors is in phosphor concentration higher than the combination of a blue LED element and a yellow phosphor, so that light confined inside the light-emitting portion increases to lower the light extraction efficiency. Also, the amount of light to be absorbed in the device substrate increases due to an increase in scattered light, so that the light extraction efficiency of the light-emitting portion further decreases. By contrast, in this embodiment, no phosphor is included in the sealing portion 324 for sealing the LED elements 321 and, instead, the phosphor layer 361 is formed on the glass member 306. Thereby, light confined in the light-emitting portion 302 can be avoided and the light extraction efficiency can be enhanced to improve the wavelength conversion efficiency. Thus, as compared to including the phosphor in the sealing portion 324, the luminous efficiency can be enhanced. The effect of enhancing the luminous efficiency becomes significant according as the light-emitting portion 302 is downsized. Also, according as the light-emitting portion 302 is downsized, the material cost can be reduced and the mass production can be done in lump, so that the production cost can be reduced. The light-emitting portion is formed with the glass and ceramic members with a low thermal expansion coefficient, so that no problem in quality occurs even when it is downsized.

Figure 24:
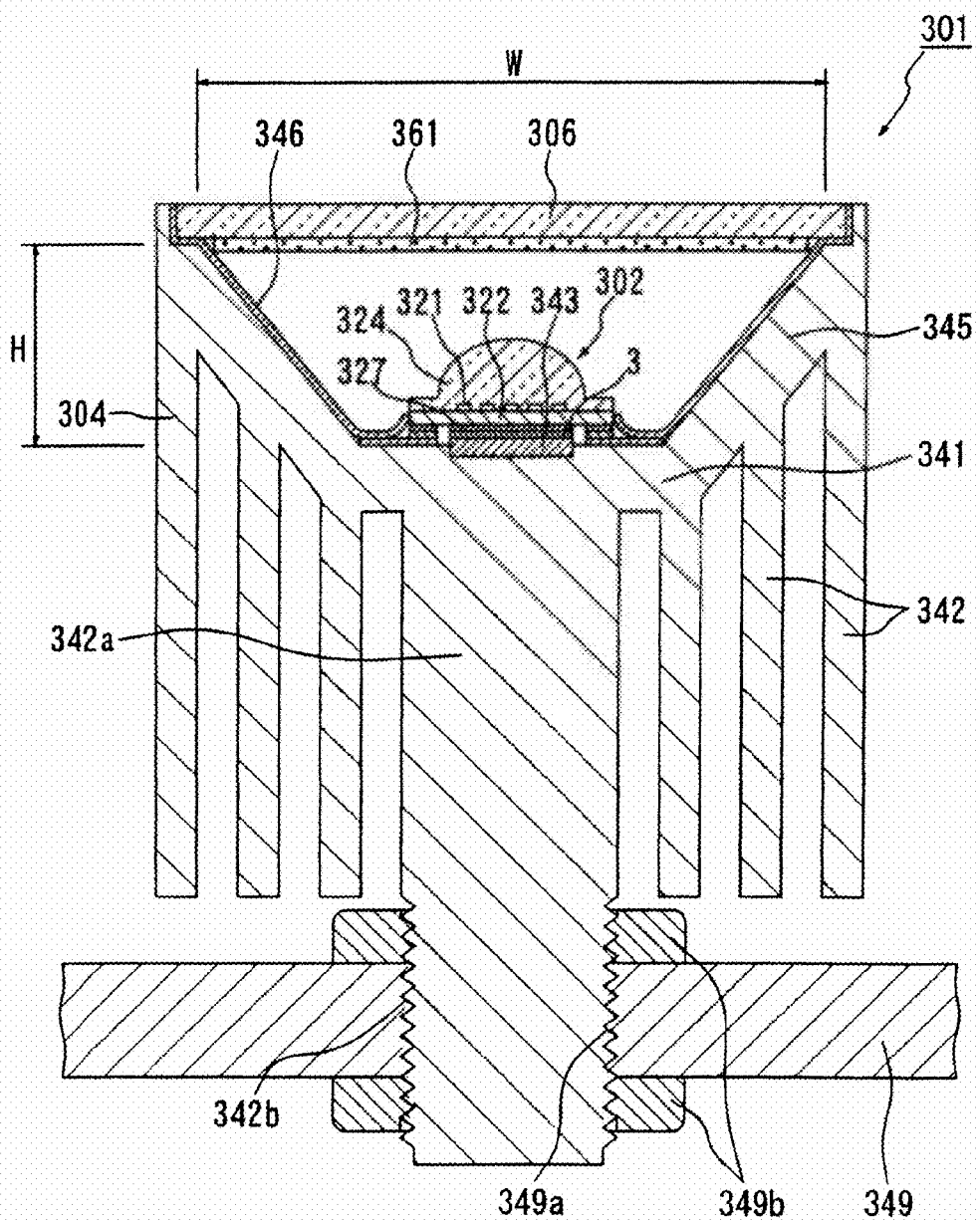
FIG. 24 is a front cross sectional view showing a modification of the fourth embodiment.

In the fourth embodiment the fins 342 of the heat dissipation member 304 are connected together by the plate member 349, and the plate member 344 is combined with the outer heat dissipation member 349. However, as shown in FIG. 24, a column part 342a thicker than the fin 342 may be formed directly under the light-emitting portions 302 and parallel to the fins 342b such that a male screw 342b of the column part 342a is screwed with a female screw 349a of the outer heat dissipation member 349. Meanwhile, as shown in FIG. 24, the light emitting device 301 is constructed such that the lower ends of the fins 342 are not connected together. In the light emitting device 301, nuts 349a screwed with the male screw 342b are disposed on and under the outer heat dissipation member 349. Thus, the light emitting device 301 operates such that heat generated at the light-emitting portions 302 can be surely flown into the column part 342a directly under the light-emitting portions 302. Even if the nuts 349b are loose, heat of the light-emitting portions 302 can be absorbed to some extent by the column part 342a so as to prevent breaking of the LED elements 32.

As shown in FIG. 24, the light emitting device 301 is constructed such that the inside surface of the wall portion 345 of the main body 341 is inclined enlarging in inner circumference upward. Therefore, as compared to not being inclined, the light attenuation rate can be reduced several percents. In this case, forming a white coating on the wall portion 345 rather than using the reflecting sheet 346 is less subject to the restriction on the formation of white surface due to the inside shape.

Figure 25:
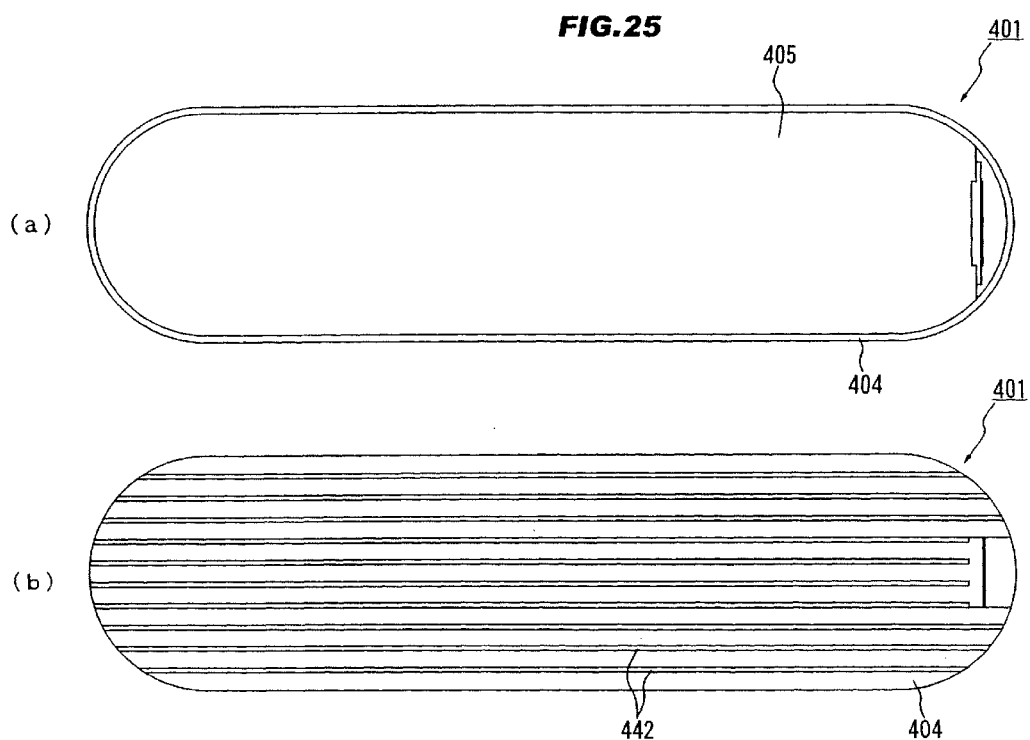
FIG. 25A is a top view showing another modification of the fourth embodiment.
FIG. 25B is a bottom view showing the modification in FIG. 25A.
Figure 26:
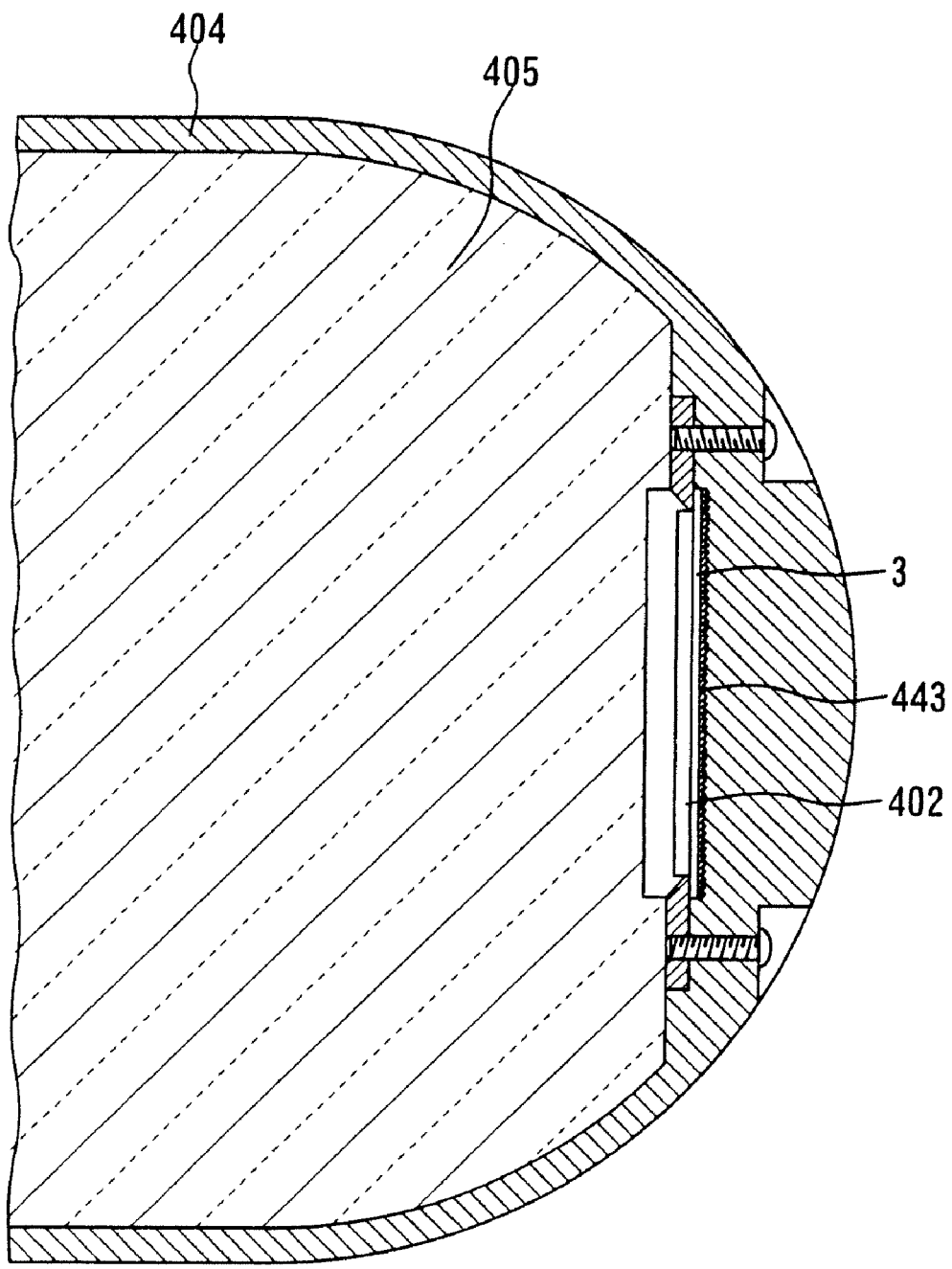
FIG. 26 is an enlarged cross sectional view showing the modification in FIG. 25A.

In the above embodiments a light guiding plate may be used to modify the light emitting device into a planar light source. For example, as shown in FIG. 25A, a light emitting device 401 may be composed of a light guiding plate 405, and a reflector 404 as a heat dissipation member for covering the light guiding plate 405 to allow one surface to be opened. As shown in FIG. 25B, the reflector 404 may be provided with plural fins 442. As shown in FIG. 26, the light emitting device 401 is constructed such that a bonding portion 443 is formed at a mount site for the light-emitting portion 402 in the reflector 404, and the light-emitting portion 402 is mounted on the reflector 404 via the solder material 3. The light-emitting portion 402 is in dimensions different from that in the above embodiments, but it is in composition the same as that in the above embodiments. Thus, explanations thereof are omitted below.

Fifth Embodiment

Figure 27:
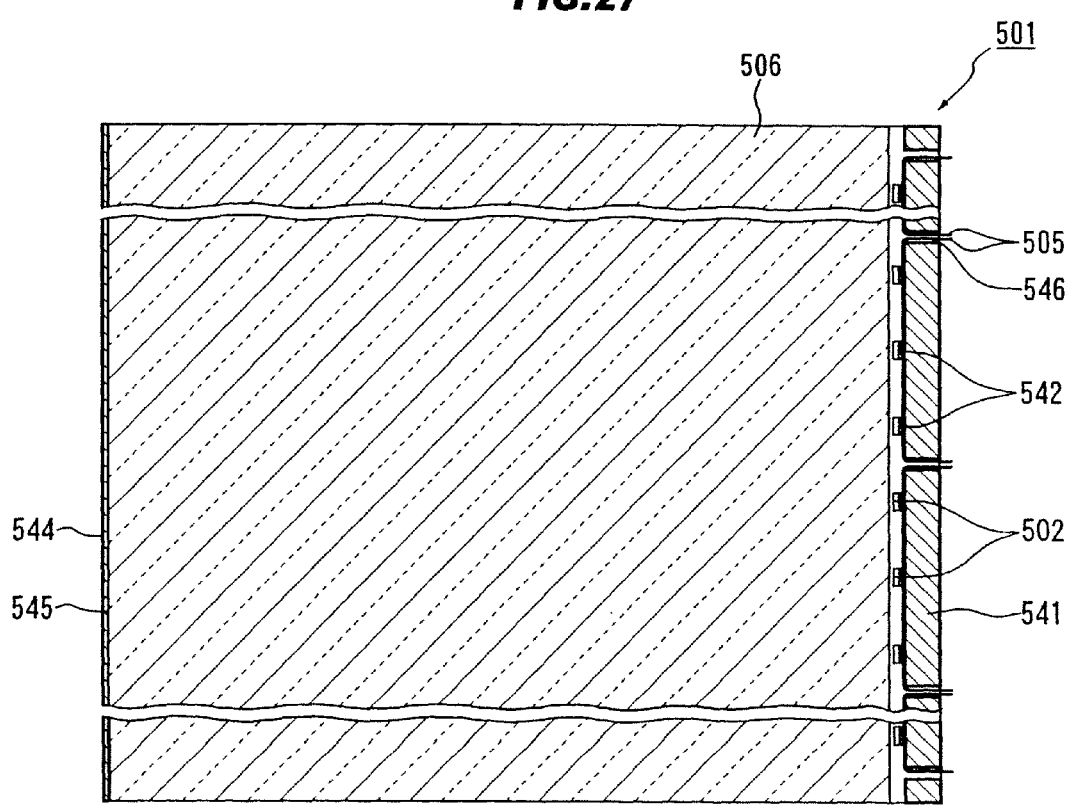
FIG. 27 is a horizontal cross sectional view showing a light emitting device in a fifth preferred embodiment according to the invention.
Figure 28:
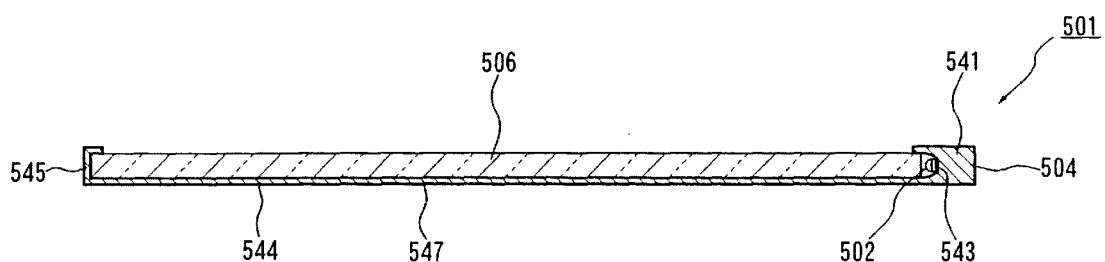
FIG. 28 is a vertical cross sectional view showing the light emitting device in FIG. 27.
Figure 29:
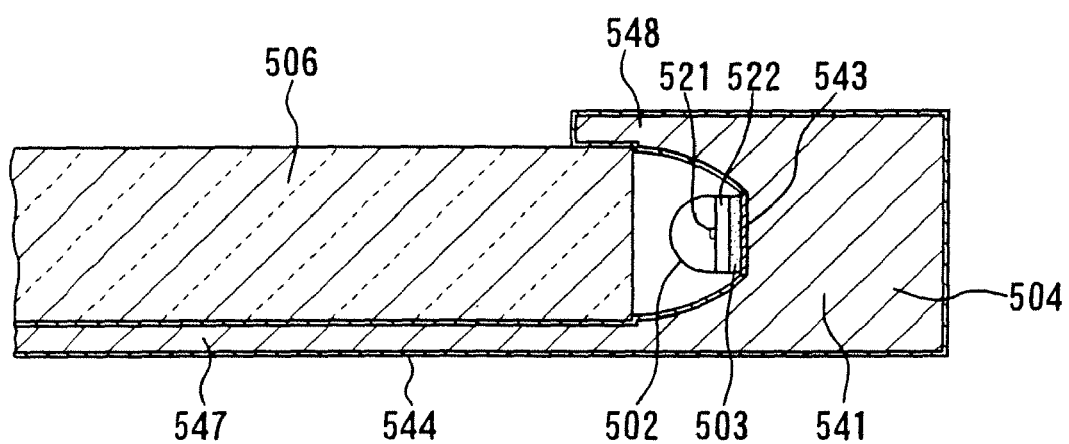
FIG. 29 is an enlarged vertical cross sectional view showing the light emitting device in FIG. 27.

FIGS. 27 to 29 illustrate a light emitting device in the fifth embodiment of the invention. FIG. 27 is a cross sectional view showing the light emitting device.

As shown in FIG. 27, the light emitting device 501 is composed of plural light-emitting portions 502 each including LED elements 521, a heat dissipation member 504 connected via a solder material 503 to the light-emitting portions 502, and a flexible substrate 505 for feeding power to the light-emitting portions 502. The light emitting device 501 is further composed of a light guiding plate 506 into an end face of which light emitted from the light-emitting portions 502 is inputted, so that the surface of the light guiding plate 506 can emit light planarly.

The heat dissipation member 504 is of aluminum, and formed by extrusion molding. The heat dissipation member 504 is composed of a mount substrate 541 formed on the side of one end of the light guiding plate 506 for mounting the light-emitting portions 502, and a flange 545 for covering the other end of the light guiding plate 506. The plural light-emitting portions 502 are mounted on the flexible substrate 505 to be electrically in series. In this embodiment, plural holes 546 are formed at predetermined intervals for passing the flexible substrate 505 therethrough.

The heat dissipation member 504 is provided with the holes 546 by cutting after being shaped by extrusion molding. Then, the heat dissipation member 504 is alumite treated to have a heat dissipation film 544 even on the edge of the holes 546. Thereby, the edge of the holes 546 can be rounded to prevent the breaking of the flexible substrate 505 and to have insulation from the flexible substrate 505 at the holes 546.

The heat dissipation film 544 is formed at a part except an end face of the mount substrate 541 of the heat dissipation member 504 opposite the light guiding plate 506. In this embodiment, the heat dissipation film 544 is of aluminum oxide film and formed by alumite treatment with the bonding portion 543 masked.

The end face of the mount substrate 541 opposite the light guiding plate 506 is entirely copper plated. The copper plated bonding portion 543 is formed on the top surface of the mount substrate 541. The bonding portion 543 is formed by plating. The light-emitting portions 502 are mounted on the bonding portions 543 via the solder material 503.

FIG. 28 is a vertical cross sectional view showing the light emitting device in FIG. 27.

As shown in FIG. 28, the heat dissipation member 504 has a back surface portion 547 that covers the back surface of the light guiding plate 506 and connects the mount substrate 541 and the flange 545. The end of the flange 545 is folded to contact the top surface of the light guiding plate 506. The heat dissipation member 504 of the embodiment is formed by extrusion molding.

FIG. 29 is an enlarged vertical cross sectional view showing the light emitting device in FIG. 27.

As shown in FIG. 29, the heat dissipation member 504 is provided with a reflecting mirror 548 that is formed connecting to the mount substrate 541 and contacts the surface of the light guiding plate 506. The inside surface of the reflecting mirror 548 is formed parabolic in cross section but may be formed linear. In this embodiment, the light-emitting portion 502 is constructed such that the LED element 521 is glass-sealed on the mount substrate 522, a metal part is disposed at the back face of the mount substrate 522, and the glass surface is formed curved (or in light-focusing shape) in vertical cross section. The solder material 503 may be of an optional material, e.g., Sn—Sb based solder, Sn—Cu based solder, Sn—Ag based solder, Sn—Zn base solder, Sn—Bi based solder etc.

The light emitting device 501 thus constructed is provided with the bonding portion 543 processed to be bonded to the solder material 503 on the heat dissipation member 504 of aluminum unable to be bonded to the solder material 503, so that the light-emitting portions 502 can be bonded via the solder material 503 to the heat dissipation member 504. Heat generated from the LED elements 521 during the operation can be smoothly transferred through the mount portion 522 and the solder material 503 to the heat dissipation member 504.

In this regard, since no oxide film is formed at the bonding portion 543 of the heat dissipation member 504, the solder material 503 can be securely bonded to the heat dissipation member 504. The light emitting device 501 is constructed such that the width of the heat dissipation member 504 including the reflecting mirror 548 is around the same as the thickness of the light guiding plate 506, so that the bonding portion 543 of the heat dissipation member 504 is relatively small in width to reduce the bonding area. However, since the thermal resistance of the bonding portion 543 is low, power fed to the light-emitting portions 502 can be increased. Thus, the amount of light can be set according to the size of the light guiding plate 506 and it is very advantageous in practical use. Even when heat is generated from the LED elements 521, the adhesion between the light-emitting portion 502 and the heat dissipation member 504 via the solder material 503 can be retained such that the light-emitting portion 502 is not separated from the heat dissipation member 504 during the operation and the thermal resistance between the light-emitting portion 502 and the heat dissipation member 504 does not increase with time. Therefore, high reliability can be secured.

The light emitting device 501 of the embodiment is constructed such that the surface of the heat dissipation member 504 is entirely covered with the heat dissipation film 544, so that the heat dissipation performance can be enhanced significantly. The heat dissipation film 544 is formed while masking the bonding portion 543 and, therefore, the heat dissipation member 504 can be simply and easily completed. Optionally, after providing a region including the mount substrate 541 or the entire heat dissipation member 504 with copper plating, by masking the mount substrate 541, white coating may be rendered to a region except the mount substrate of the light-emitting portions 502 by using a material formed by wrapping with polyester a resin such as melamine, acryl, urethane, silicone, fluorine-based etc. and an inorganic powder or by using an inorganic material with e.g., $SiO_2$-based alkoxide including particles of $TiO_2$, ZrO etc. By the white coating, the heat dissipation performance can be enhanced. Since the back surface reflecting plate of the light guiding plate 506 does not need a high linear reflectivity, decrease in reflectivity due to the plating may be compensated by the white coating. Optionally, Au plating may be applied on the copper plated surface and the production cost can be reduced by applying the Au plating, which is costly, only to necessary part. In particular, acrylic resin, polyester inorganic powder coating and inorganic material coating are excellent in stability to light and heat and less in deterioration with time.

The light emitting device 501 of the embodiment operates such that heat can be transferred through the mount substrate 541 to the back surface 547 and the flange 545.

Thus, by using the frame member of the light guiding plate 506 as a heat dissipation member, the heat dissipation performance of the device can be enhanced.

In the above embodiments the heat dissipation members are of aluminum. However, even when the heat dissipation members are of aluminum alloy, magnesium or magnesium alloy, the same effects as in the embodiments can be obtained since the oxide film is likely to be formed on the surface.

Figure 30:
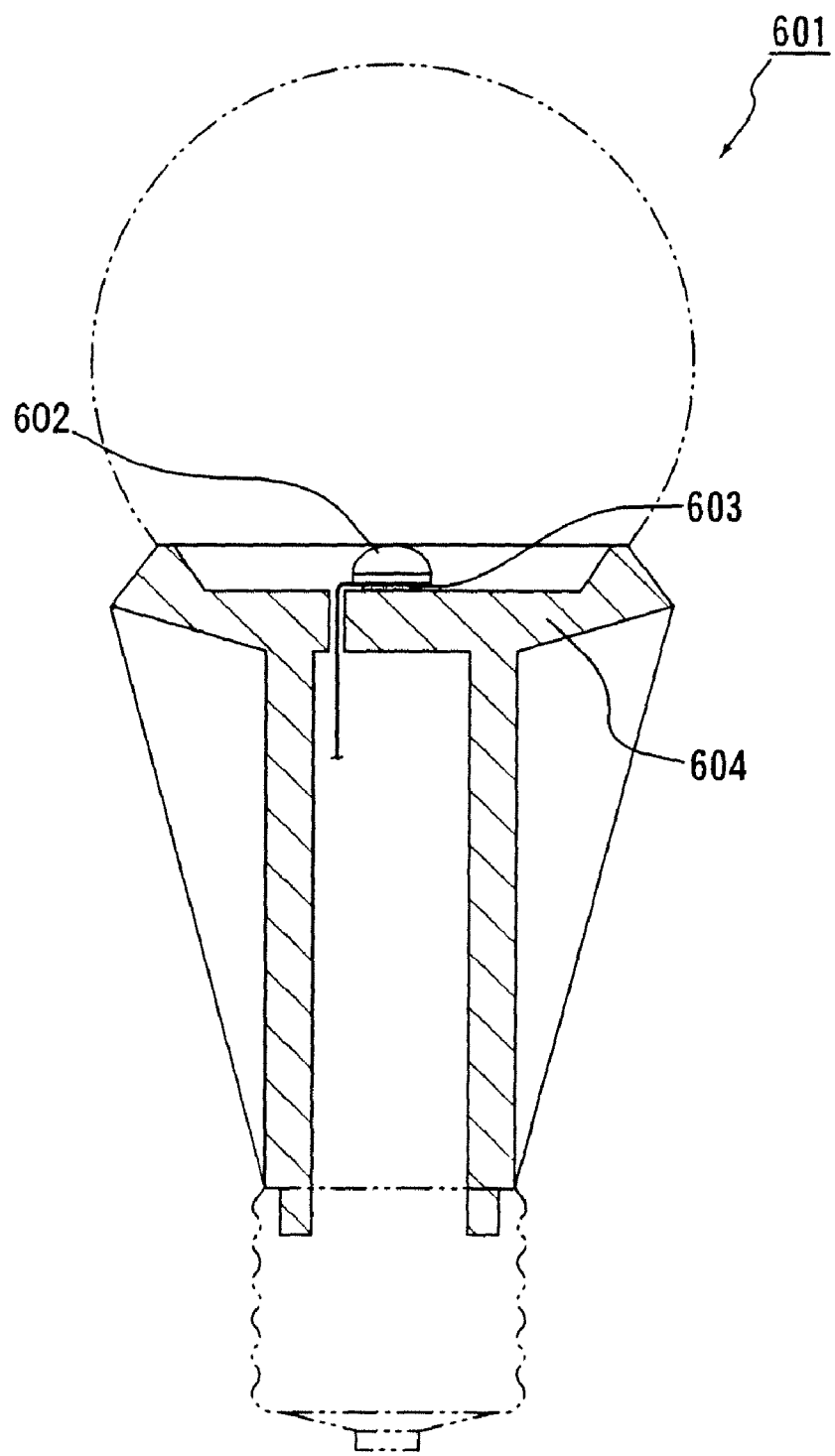
FIG. 30 is a front cross sectional view showing a modification of the above embodiments.

Optionally, as shown in FIG. 30, the invention can apply to a bulb-type light emitting device 601. The light emitting device 601 in FIG. 30 is composed of a light-emitting portion 602 that includes a metal part of a metal able to be bonded to a solder material 603, and a heat dissipation member 604 that is of aluminum alloy, magnesium or magnesium alloy and includes a bonding portion processed to be bonded to the solder material 603. The metal part of the light-emitting portion 602 is bonded via the solder material 603 to the bonding portion of the heat dissipation member 604. The solder material 603 is a material unable to be directly bonded to the heat dissipation member 604. The metal part of the light-emitting portion 602 is formed by metalizing an insulation of ceramic or semiconductor. The bonding portion has a thermal expansion coefficient between that of the heat dissipation member 604 and that of the insulation.

Although the invention has been described with respect to the specific embodiments and Examples for complete and clear disclosure, the appended claims are not to be thus limited. In particular, it should be noted that all of the combinations of features as described in the embodiment and Examples are not always needed to solve the problem of the invention.

What is claimed is:

1. A light emitting device, comprising:
a light-emitting portion including a metal part comprising a metal that bonds to a solder material; and
a heat dissipation member that comprises aluminum, an aluminum alloy, magnesium, or a magnesium alloy, and a bonding portion that bonds to the solder material,
wherein the metal part of the light-emitting portion is bonded via the solder material to the bonding portion of the heat dissipation member,
wherein the solder material comprises a material unable to be directly bonded to the heat dissipation member,
wherein the metal part of the light-emitting portion comprises a metalized insulation of a ceramic or a semiconductor, and
wherein the bonding portion has a thermal expansion coefficient between that of the heat dissipation member and that of the metalized insulation.

2. The light emitting device according to claim 1, wherein the heat dissipation member comprises a main body extending from the bonding portion in a predetermined direction, and a plurality of fins integrated with the main body.

3. The light emitting device according to claim 2, wherein the light-emitting portion comprises an LED (light-emitting diode) element, a mount portion of ceramics for mounting the LED element, a sealing portion of an inorganic material for sealing the LED element on the mount portion.

4. The light emitting device according to claim 3, wherein the main body of the heat dissipation member is formed into a plate, the light-emitting portion is mounted on an end face of the main body, and the fins extend from a main surface of the main body.

5. The light emitting device according to claim 3, wherein the heat dissipation member forms a housing comprising an opening for enclosing the light-emitting portion, and
wherein the light emitting device further comprises a phosphor layer at the opening for converting a wavelength of light emitted from the light-emitting portion.

6. The light emitting device according to claim 3, wherein the heat dissipation member further includes a reflecting mirror portion for reflecting light emitted from the light-emitting portion.

7. The light emitting device according to claim 6, wherein the light-emitting portion comprises a plurality of light-emitting portions that form a linear light source while being arranged in a row.

8. The light emitting device according to claim 7, wherein the bonding portion comprises aluminum, an aluminum alloy, magnesium, or a magnesium alloy, and a metal that bonds to the solder material and is dispersed into the aluminum, aluminum alloy, magnesium, or magnesium alloy.

9. A method of producing the light emitting device according to claim 1, said method comprising:
disposing a metal member that bonds to the solder material on a surface of the heat dissipation member that comprises aluminum, an aluminum alloy, magnesium, or magnesium alloy, and is formed by extrusion molding or die casting; and
forming the bonding portion by pressing the metal member while applying ultrasonic wave to an interface between the heat dissipation member and the metal member.

10. The method according to claim 9, wherein the metal member comprises a metal foil, and
wherein the pressing of the metal foil is conducted by using a tool with a concavo-convex surface formed on a contact surface with the metal foil.

11. The method according to claim 9, wherein the bonding portion is formed after the heat dissipation member is previously alumite treated.

12. The light emitting device according to claim 1, wherein the metal part is disposed on an upper surface of the solder material, and
wherein a bottom surface of the solder material, which opposes the upper surface of the solder material, is disposed on a surface of the bonding portion.

13. The light emitting device according to claim 1, wherein opposing surfaces of the solder material abut a bottom surface of the metal part and an upper surface of the bonding portion, respectively.

14. The light emitting device according to claim 1, wherein the bonding portion comprises a metal layer that bonds to the solder material.

15. The light emitting device according to claim 14, wherein a metal of the metal layer is dispersed into the heat dissipation member.

16. A light emitting device, comprising:
- a light-emitting portion including a metal part comprising a metal that bonds to a solder material; and
- a heat dissipation member that comprises one of aluminum, an aluminum alloy, magnesium, and a magnesium alloy, said heat dissipation member comprising a bonding portion that bonds to the solder material,
- wherein the metal part of the light-emitting portion is bonded via the solder material to the bonding portion of the heat dissipation member,
- wherein the solder material comprises a material unable to be directly bonded to the heat dissipation member, and
- wherein the bonding portion has a thermal expansion coefficient between that of the heat dissipation member and that of the metal part.

17. The light emitting device according to claim 16, wherein the metal part of the light-emitting portion comprises a metalized insulation of a ceramic or a semiconductor.

18. The light emitting device according to claim 16, wherein opposing surfaces of the solder material abut a bottom surface of the metal part and an upper surface of the bonding portion, respectively.

19. The light emitting device according to claim 16, wherein the bonding portion comprises a metal layer that bonds to the solder material, a metal of the metal layer being dispersed into the heat dissipation member.

* * * * *